United States Patent [19]

Hoagland

[11] 4,038,690
[45] July 26, 1977

[54] CHARGE-COUPLED DEVICE VIDEO-SIGNAL-GENERATING SYSTEM

[75] Inventor: Kenneth A. Hoagland, Smithtown, N.Y.

[73] Assignee: Fairchild Camera and Instrument Corporation, Syosset, N.Y.

[21] Appl. No.: 651,117

[22] Filed: Jan. 21, 1976
(Under 37 CFR 1.47)

[51] Int. Cl.² .......................................... H04N 3/14
[52] U.S. Cl. .................................... 358/213; 357/24; 357/30
[58] Field of Search ................... 178/7.1; 358/41, 213; 357/24, 30, 31

[56] References Cited
U.S. PATENT DOCUMENTS 3,975,760  8/1976  Yamanaka et al. ................. 358/41
B 468,100  3/1976  Woywood ............................ 178/7.1

Primary Examiner—John C. Martin
Assistant Examiner—Mitchell Saffian
Attorney, Agent, or Firm—Laurence B. Dodds

[57] ABSTRACT

A video-signal-generating system comprises a pair of similar charge-coupled area-image-sensing devices, each comprising a two-dimensional array of photosensor sites arranged in rows and columns, each site being effective to produce a charge packet in response to illumination incident thereon, a charge-detection output circuit capable of producing an output signal varying with the magnitudes of successive charge packets in sequence, and a plurality of charge-storing sites located intermediate the photosensor sites and the charge-detection circuit for effecting the orderly transfer of charge packets from the photosensor sites in sequence to the charge-detection circuit. The system also includes an optical system for simultaneously imaging a scene to be reproduced on each of the charge-coupled area-image-sensing devices where each device is positioned with respect to corresponding image points such that photosensor sites of one of the devices are offset along row and column directions within the image plane from corresponding photosensor sites of the other device. One example described comprises two image-sensing devices with the offset made equal to one row spacing of photosensor sites in one direction and one-half column spacing of photosensor sites in the other direction. The system also includes means for combining the output signals of the output circuits of the image-sensing devices to provide a video signal for reproduction.

10 Claims, 19 Drawing Figures

CHARGE-COUPLED DEVICE VIDEO-SIGNAL-GENERATING SYSTEM

BACKGROUND OF THE INVENTION

1. Field of the Invention

This invention is suitable for use in substitution for the conventional television signal-generating system embodying a cathode ray camera tube and accessories. It is well known that such systems, while yielding entirely satifactory performance, are extremely complex, bulky, and costly. The video-signal-generating system of the present invention replaces the conventional cathode-ray camera tube with a semiconductor charge-coupled device of the area-image-sensing type and is light-weight, compact, and relatively inexpensive and particularly suitable for use as a portable system.

2. Description of the Prior Art

It has heretofore been proposed to use a charge-coupled device as an area-image sensor to develop a serial video signal for reproducing the sensed image on a receiving cathode-ray tube. One image-sensing system useful in such field is described and claimed in the co-pending application of Lloyd R. Walsh, Ser. No. 391,119, filed Aug. 27, 1973, entitled "Charge-Coupled Area Array", now abandoned, and assigned to the same assignee as the present invention. However, for certain applications, the resolution of the image reproduced from a signal generated by such a system is somewhat lower than desired.

Therefore, an object of the invention is to provide a new and improved charge-coupled device video-signal-generating system which generates a signal yielding a reproduced image made up of a larger number of picture elements and/or a larger number of scanning lines, yielding higher resolution than possible with prior art systems of this type without increasing the input image format size and without increasing the device readout clock rate.

It is a further object of the invention to minimize or eliminate aliasing, that is, spurious or false image-signal generation which can occur with single area-image-sensing arrays having nonphotosensitive patterned regions within the image formate region.

SUMMARY OF THE INVENTION

In accordance with the invention, a video-signal-generating system comprises a plurality o similar area-image-sensing devices, each comprising a two-dimensional array of photosensor sites arranged in rows and columns, each site being effective to produce a charge packet in response to illumination incident thereon, a charge-detection output circuit capable of producing an output signal varying with the magnitudes of successive charge packets in sequence, and means for effecting the orderly transfer of chargepacket-signal information from the photosensor sites in sequence to such charge-detection circuit. The system also includes an optical system for simultaneously imaging a scene to be reproduced on each of the area-image-sensing devices but with the photosensor sites of at least one device offset within the image plane from corresponding photosensor sites of the others of such devices to such an extent and in such a direction that the photosensor sites of such one device sense or provide access to image point information which cannot be sensed or accessed by the others of such devices during the same field readout interval. The system also includes control circuitry for periodically and sequentially causing the transfer of the charge-packet-signal information developed at each of the photosensor sites to the charge-detection output circuit of its respective device and means for combining the output signals of the output circuits of the devices to provide a video signal for reproduction.

For a better understanding of the present invention, together with other and further objects thereof, reference is had to the following description, taken in connection with the accompanying drawings, while its scope will be pointed out in the appended claims.

BRIEF DESCRIPTION OF THE DRAWINGS

FIG. 16 is a schematic diagram of a line counter and decoder unit constituting one component of the combinational logic unit of FIG. 1 as configured to provide an alternate mode of operation; while

DESCRIPTION OF THE PREFERRED EMBODIMENTS

Figure 1:
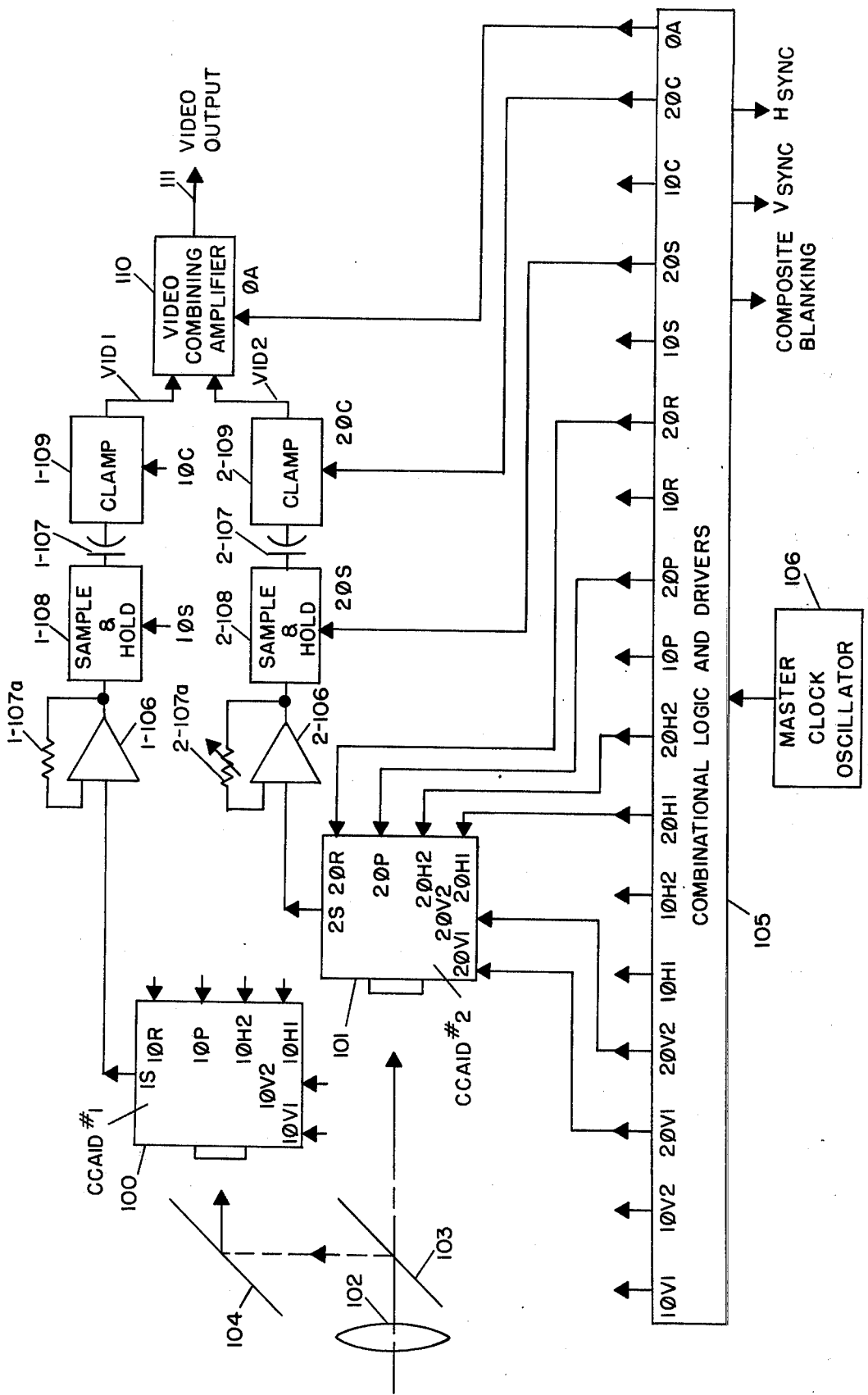
FIG. 1 is a single-line signal-flow schematic diagram of a charge-coupled device video-signal-generating system embodying the invention.

It is believed that the invention may be explained most readily by a general description of the over-all system represented by the single-line signal-flow schematic diagram of FIG. 1, followed by detailed descriptions of the essential components of the system.

FIG. 1 is a single-line signal-flow diagram representing a video-signal-generating system embodying the invention and comprising two similar charge-coupled area-image-sensing devices (CCAID) 100 and 101, each comprising a two-dimensional array of photosensor sites arranged in horizontal rows and vertical columns, a plurality of charge-storing sites interspersed between the columns of photosensor sites, and a row of charge-storing sites adjacent a terminal row of photosensor sites. The CCAIDs are shown in detail in the fragmentary views of FIGS. 2 and 3 and will be described in detail hereinafter.

The system of FIG. 1 further includes an optical system comprising an objective lens 102 for projecting an image to be translated onto a half-silvered 45° mirror 103 which transmits the imge to the CCAID 101 (No. 2) and simultaneously reflects the same image via a second 45° mirror 104 to CCAID 100 (No 1). The mirrors 103 and 104 and the CCAIDS are so positioned and oriented that corresponding points of a scene image are simultaneously and congruently reproduced at image planes containing the photosensitive surfaces of CCAID 100 and CCAID 101. However, with respect to scene image points within these image planes, the photosensor sites of one device are offset from corresponding photosensor sites of the other device to such an extent and in such a direction that the photosensor sites of the one device sense, or provide access to, image points which cannot be sensed or accessed by the other of such devices during the same field readout interval. Specifically, in one preferred embodiment to be described hereinafter, each device is positioned with respect to the corresponding image points of said congruent images such that the photosensor sites of one device are offset by one row space in the vertical direction and one-half column space in the horizontal direction from the corresponding photosensor sites of the other device.

The system further comprises control circuitry for periodically and sequentially transferring charge packets developed at each of the photosensor sites of each column to adjacent charge-storing sites and for sequentially transferring charge packets from all of the columns of charge-storing sites to the terminal row of charge-storing sites. This control circuitry is represented by the combinational logic unit 105, described hereinafter, timed by a master clock oscillator 106. The logic unit 105 develops the following groups of signals for each of the CCAID units:

$\phi$V1 and $\phi$V2 — for transferring the charge packets vertically from row-to-row in each column.

$\phi$H1 and $\phi$H2 — for transferring the charge packets horizontally from the terminal site of each column to the next column.

$\phi$P — for transferring the charge packets horizontally from the photosensor sites to adjacent charge-storing sites.

$\phi$R — for resetting the charge-detection circuit following signal detection.

$\phi$C — for actuating signal-clamping circuits (to be described hereinafter).

$\phi$S — for actuating signal-sampling and holding circuits (to be described hereinafter).

$\phi$A — for actuating the input selection circuits of the combining amplifier (to be described hereinafter).

For simplicity, the connections from the logic unit are shown only to CCAID No. 2, but it is obvious that corresponding connections are made from the logic unit 105 to the corresponding terminals of CCAID No. 1.

Figure 2:
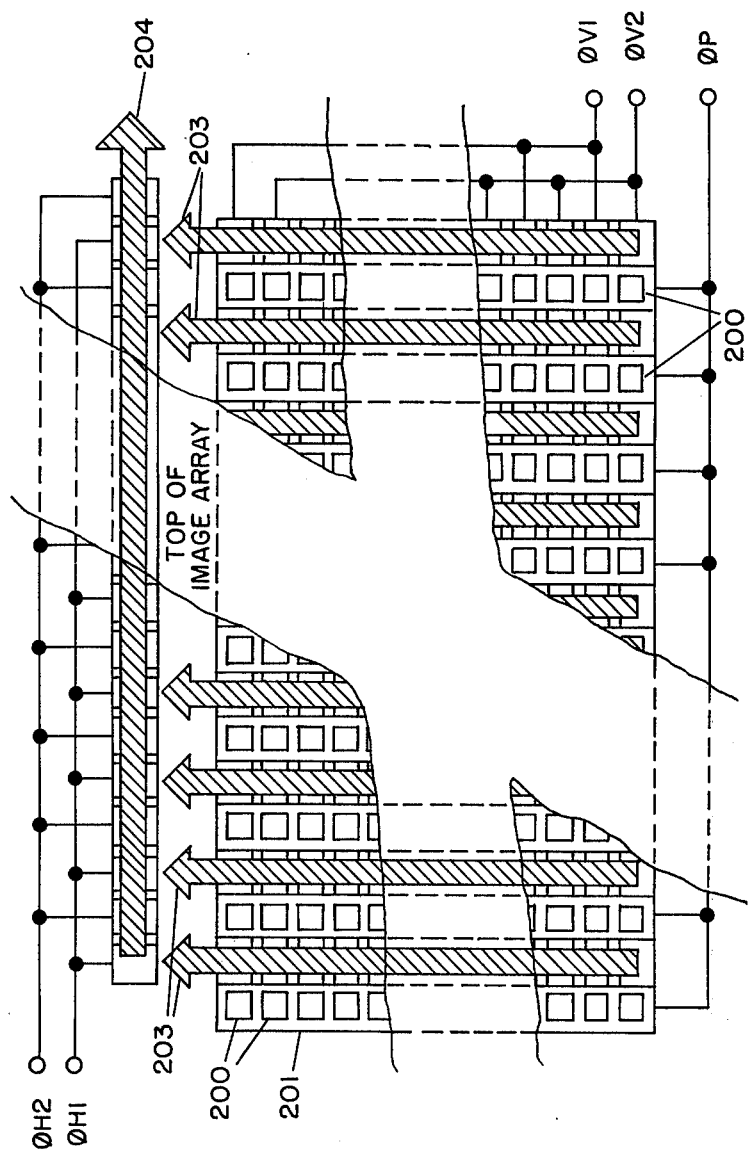
FIG. 2 is a fragmentary schematic view of the area array and output register portions of a charge-coupled area-image-sensing device suitable for use in the system of FIG. 1.

Referring now to FIG. 2, there is shown a fragmentary view of a complete CCAID suitable for use as units 100, 101 of FIG. 1 and presently commercially available as "Fairchild Solid State Area Image Sensor - CCD201" and described in the Preliminary Data Sheet on that device, Copyright 1974. This unit has an array of photosensors 200 arranged in 100 rows and 100 columns on a silicon substrate 201, the photosensors being represented by open white squares in the figure. A vertical shift registers consisting of 100 cells is located adjacent each vertical column of photosensor elements 200, shown schematically in FIG. 2 by the shaded vertical arrows 203 to the right of their respective columns of photosensors. Above the array of photosensor elements is a horizontal shift register represented by the horizontal shaded arrow 204.

Figure 3:
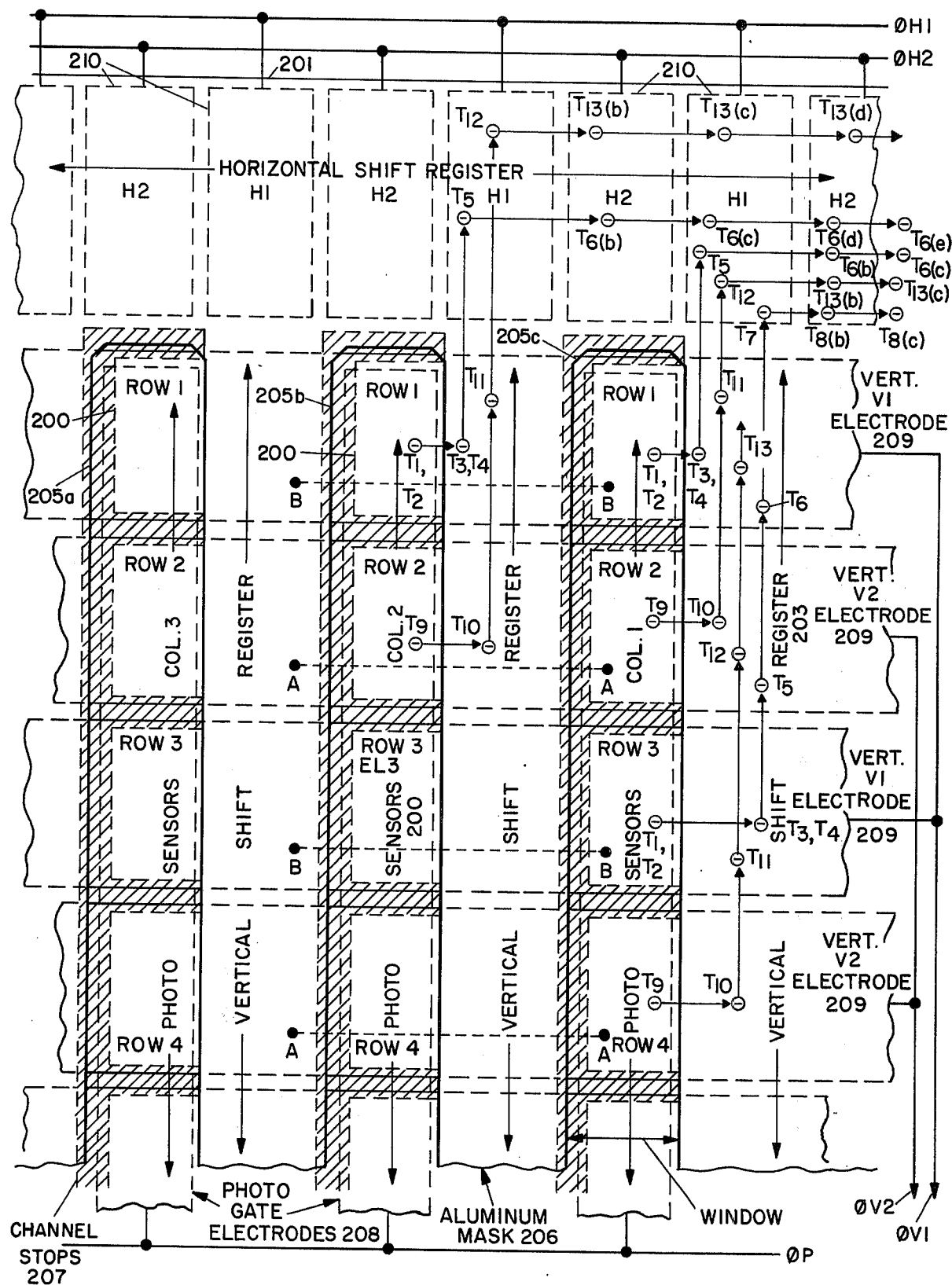
FIG. 3 is an enlarged schematic view of a region at the upper right-hand corner of the device of FIG. 2.

An enlarged view of the upper right-hand corner of the array of FIG. 2 is shown in FIG. 3 in which each of the photosensor elements is identified by row and column numbers with reference to the upper right-hand corner of the unit. The details of fabrication of such a CCAID are disclosed in the copending application of Gilbert F. Amelio, Ser. No. 357,760, filed May 7, 1973, entitled "Transfer Gate-Less Photosensor Configuration", now abandoned, and assigned to the same assignee as the present application. The following summary of the construction and operation of such a device is believed to be sufficient for the purpose of explaining the present invention.

Channel stops 207, shown cross-hatched, are formed within the silicon substrate surrounding three sides of each of the photosensor elements and serving as a barrier between the electron-charge packets.

A layer of insulating silicon oxide is formed over all of the surface of the substrate and 100 vertical ribbon electrodes, called photogate electrodes 208, are formed over each vertical column of photosensor elements. Then an additional layer of silicon oxide insulation is deposited over the photogate electrodes 208 and 100 horizontal ribbon electrodes 209, termed vertical transport electrodes V1 and V2, are applied, one over each row of photosensor elements, as shown in FIG. 3. A layer of insulating silicon oxide is then deposited over all the electrodes 209.

After all of the electrodes and insulation have been formed on the surface of the substrate 201 as described, a layer of aluminum is deposited over the entire surface and long narrow vertical slots 205a, 205b, . . . are formed in the aluminum as windows located over the columns of the photosensor elements 200 so that the aluminum layer forms an opaque mask 206 for all of the elements of the device beneath it except the photosensor elements 200.

Still referring to FIG. 3, solid lines in the window areas and dashed lines under the aluminum show the vertical transport electrodes 209. Solid lines between the vertical electrodes 209 and dashed lines under these electrodes show the photogate electrodes 208. FIG. 2b of aforesaid copending application Ser. No. 357,760, now abandoned, shows a similar structure along the lines A—A and B—B in FIG. 3.

Across the top of FIG. 3 there is a row of dashed-line rectangles (since they are under the aluminum light mask) which represent the electrodes 210 of a horizontal shift register, alternately labeled H1 and H2. Both the photogate electrodes 208 and the vertical transport electrodes 209, as well as the insulating silicon oxide, are semi-transparent so that the light passes through these into the silicon substrate where it produces the free electrons that form the charge packets utilized in the operation of the CCAID unit.

Consider next the operation of the CCAIDS, assuming the generation of the timing and control signals by the combinational logic unit 105, as described hereinafter. The first preferred embodiment to be described is the configuration in which each device is positioned with respect to the other so that corresponding image points of the two identical images are positioned such that those impinging on the photosensor sites of one device are offset by one row space in the vertical direction and one-half column space in the horizontal direction from those impinging on the corresponding photosensor sites of the other device. The CCAID arrays 100, 101 are controlled to provide interlaced scanning operation, alternate scanning fields containing either all odd-numbered lines or all even-numbered lines. In a single field scan of each CCAID, there is therefore a gap between the lines that are read out. However, in this configuration, these gaps occurring in the scanning of CCAID 100 are filled in by using lines (or rows) from CCAID 101. Since there is a one-line displacement between the two CCAIDs, the resultant video output signal corresponds to a continuous flow of image information with twice the number of lines per field that can be achieved with a single CCAID. As described above, each row of each array consists of photosensor elements interspersed with shift register elements so that, in scanning a horizontal row of photosensor elements, continuous optical coverage is not provided. Therefore, the two CCAIDS are offset laterally by one-half the spacing of the vertical columns of photosensor elements so that the gap in horizontal coverage of one array is filled in on alternate fields by the other array. As a result of multiplexing the two arrays 100, 101, the combined or resultant field will contain 100 lines. The image formed by the two interlaced fields actually is displayed as a 200-line raster with 100 elements per line. Thus the video output and the image display contain twice the number of image information samples that would be available from only a single CCAID.

Let I refer to the scanning array of the CCAID 100 and II refer to the scanning array of the CCAID 101. The sequence of lines in the displayed composite odd-line field is then I-1, II-1, I-3, II-3, I-5, . . . II-97, I-99, II-99. Similarly, in the even-line field, the line sequence is I-2, II-2, I-4, II-4, I-6 . . . II-96, I-98, II-98, I-100, II-100. The interlaced operation of the two CCAIDSs 100,101 as described is achieved by optically offsetting the image of the scene onto the CCAIDs, as described above and by applying properly phased clocking and control signals to the two arrays.

Figure 4:
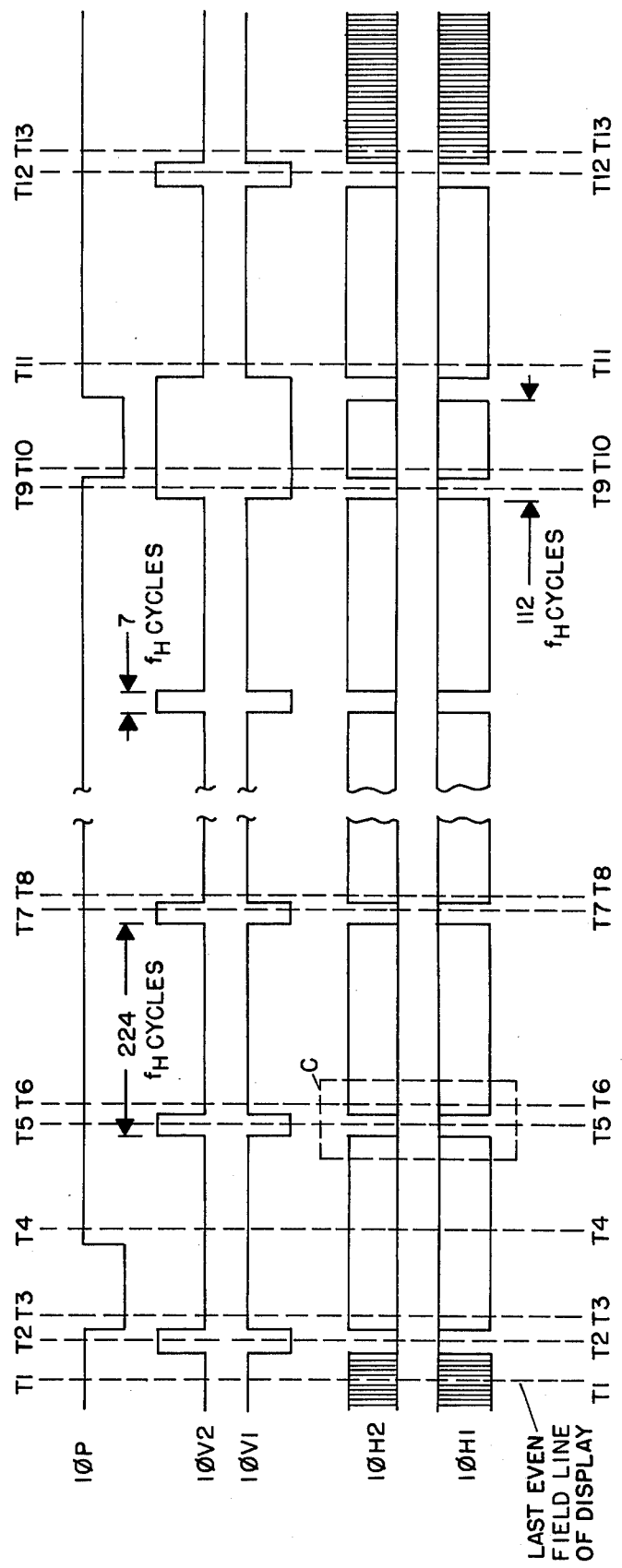
FIG. 4 comprises a representation of the waveforms of the timing signals for one of the area-image-sensing devices of FIG. 1.
Figure 5:
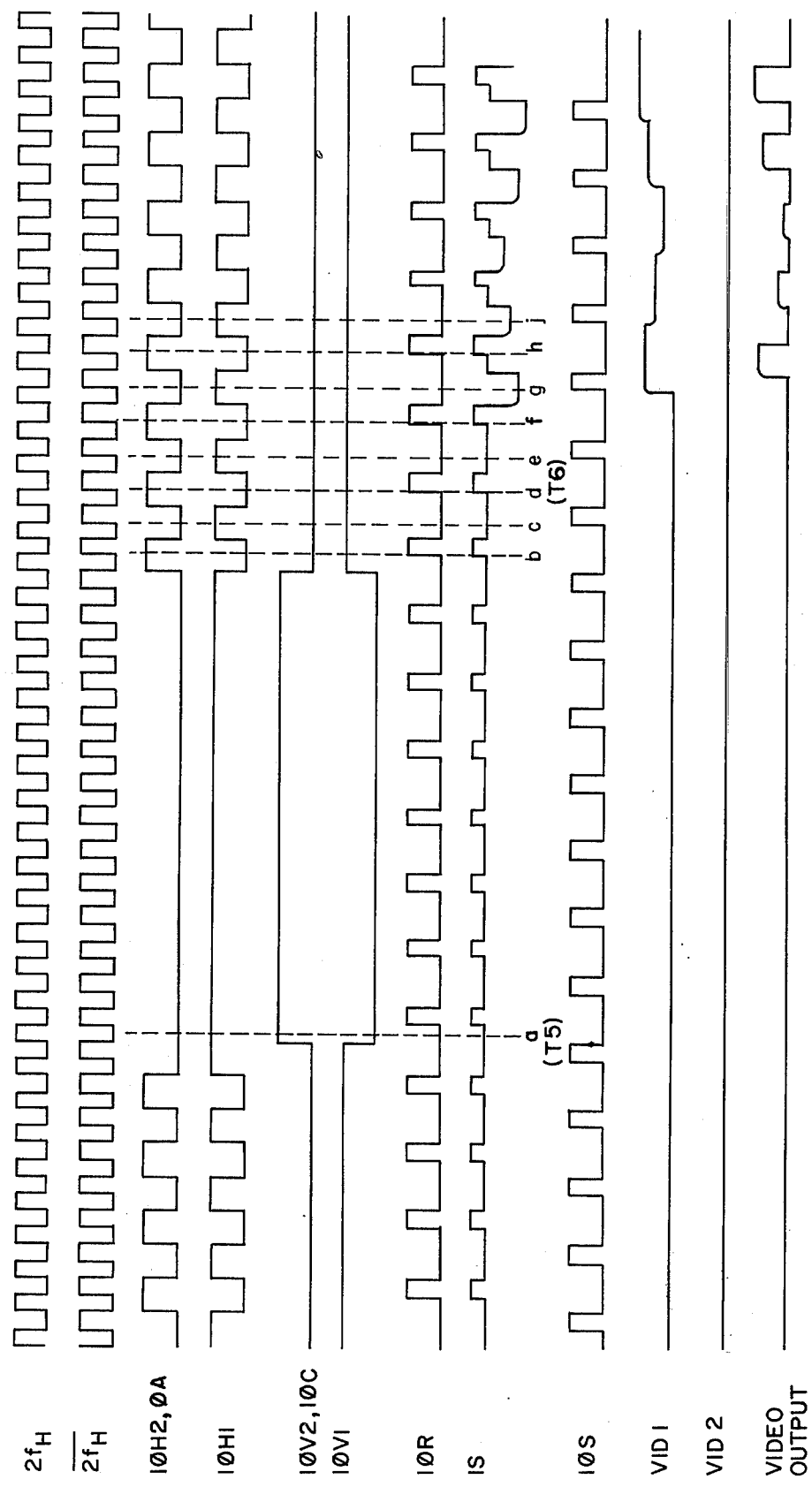
FIG. 5 is an expanded scale reproduction of a portion of the waveforms of FIG. 4 to aid in explanation of the invention.

Refer now to FIG. 4 which represents waveforms of the timing and control signals applied to one of the CCAID units, specifically the unit 100 (CCAID No. 1), it being clear that the other CCAID is similarly controlled except for different phasing. Refer also to FIG. 5 which is an expanded scale reproduction of the portion C of FIG. 4.

In FIGS. 3, 4, and 5, time-reference points T1 to T3 have been added to aid in the description. The starting point for the operation description is time T1, which has been selected as an instant during the readout and display of the last horizontal line in the second or even-numbered field of a displayed video frame, in this case the line sensed by row 100 of the CCAID 101 of FIG. 1 (CCAID No. 2).

Time instants T2 to T5 occur during the blanked time allowed for vertical flyback. Time T6 is at the start of the readout and display of the first displayed picture line of the first or odd-numbered field of the next video frame, the line sensed by row 1 of the CCAID 100. Time T7 is during the blanked time allowed for horizontal flyback after the video from row 1 of both CCAIDs has been read out and displayed. Time T8 is at the start of the readout and display of row 3 of the CCAID 100 (the next row in the CCAID readout sequence).

Time instants T9 to T12 occur during the blanked time allowed for vertical flyback following display of the last picture line of the first or odd-numbered field. Time T13 is at the start of the readout and display of the first horizontal line of the second or even-numbered field. This is displayed picture line 2 since it is displayed in the space between picture line 1 and picture line 3 which were displayed in field one. This picture line is sensed by row 2 of the CCAID 100.

During a scanning field, a positive voltage $1\phi P$ is applied to all the photogate electrodes as shown at time T1, FIG. 4. Also at time T1, as shown by waveforms $1\phi V1$ and $1\phi V2$, the voltage on the vertical transport electrodes V1 is high and on the vertical transport electrodes V2 is low. The potentials along line B—B of FIG. 3 are as shown in FIG. 1a of aforesaid copending application Ser. No. 357,760 at 16a, 16b, and 16c; along line A—A of FIG. 3 the potentials are as shown at 16a, 16d, and 16e. At time T2, the voltages on the vertical V1 and V2 electrodes are reversed: $1\phi V2$ is now high (and the potential along line A—A of FIG. 3 is as shown at 16a, 16b, and 16c of aforesaid FIG. 1a) and $1\phi V1$ is low (and the potential along line B—B of FIG. 3 is as shown at 16a, 16d, and 16e of aforesaid FIG. 1a). Therefore, during the whole field time prior to T2, the electrons stay under the photogate electrodes and the charge builds up or integrates.

At time T3 at the end of the field, the voltage $1\phi V1$ goes high again and $1\phi V2$ goes low; simultaneously the photogate voltage $1\phi P$ goes low. Therefore, the potential along line B—B of FIG. 3 is as shown in aforesaid copending application Ser. No. 357,760 FIG. 1b at 16f, 16g, and 16h. Referring to the electrons in the photosensor site in column 1, row 1, they remain in the photosensor site until after time T2. At time T3, they move to the right out of the photosensor site and into the adjacent vertical shift register cell, as illustrated in FIG. 3. The potential along line A—A then is as shown at 16f, 16d, and 16e of FIGS. 1b and 1a of aforesaid copending application since the voltage on electrode $1\phi V2$ is low. Therefore, electrons in all even-numbered photosensor sites do not move but remain in the photosensor site. Electrons in photosensor site of column 1, row 3 also move to the right at time T3 into the vertical shift register. In fact, the electrons in the photosensor sites in all the odd-numbered rows in all the columns move to the right, out of the photosensor site and into the adjacent cells of the vertical shift registers.

At time T4, the photogate voltages all go high again and start integrating charges in the odd-numbered photosensor sites for the next odd-numbered field. However, the electrons just transferred to the adjacent vertical shift register cells do not move because they are under electrodes V1 whose voltages remain high.

Time 15 is an instant shortly after the voltage $1\phi V1$ goes low and $1\phi V2$ goes high. Since the voltage $1\phi H1$ applied to the horizontal shift register electrodes over the cells marked H1 is also high, the electrons move from vertical shift register cells of row 1 into the H1 horizontal shift register cells. Also, those electrons from photosensor elements of row 3 that were in the vertical shift register cells of row 3 move upward to the row 2 vertical shift register cells. The electron charge packets move from all the odd-numbered row cells to the next even-numbered row cells along all of the vertical shift registers.

At time T6, the voltages on the horizontal shift register cells H1 and H2 start alternating high and low, as at times b, c, d, e, .... in the expanded view of FIG. 5, causing the electrons that were moved into the H1 cells at time T5 to move one cell to the right with each alternation of voltage; that is, from the odd-numbered to the even-numbered cells when the voltage $1\phi H2$ is high and from the even-numbered cells to the next odd-numbered cells to the right when voltage $1\phi H1$ again goes high. Finally, at time g, the electrons from the first column get to the output of horizontal shift register 204 and constitute the first video output signal from the first element of the first row in the odd-numbered field, represented by the waveform Vid 1, FIG. 5. Similarly, electrons from column 2, row 1 reach the shift register output at time j and so on.

At time T6, also, the electrons that originally came from row 3 move from row 2 to row 1 vertical shift register cells. At time T7, $1\phi V2$ goes high and $1\phi V1$ goes low and, since the horizontal clock pulses stop with $1\phi H1$ high, the electrons from row 3 that have progressed to vertical shift register cell of row 1 move into horizontal shift register cell H1. Beginning at time T8, when the horizontal clock pulses start again, the packet of electrons progresses along the horizontal shift register 204 to its output and out into the external video circuit. In this way the cycle is repeated, moving each row of electron charge packets up the associated vertical shift registers 203 into the horizontal shift register 204 and along it to its output circuit until the whole 50 rows of the odd-numbered field from CCAID 100 have been read out.

At the end of this odd-numbered field, at time T9, the horizontal clock pulses stop with H1 cell voltage high, electrode voltage $1\phi V1$ low, and voltage $1\phi V2$ high. At time T10, the photogate voltage $1\phi P$ goes low. Under this condition, with $1\phi V2$ applied to all the even-numbered row vertical transport electrodes high, the potentials along line A—A of FIG. 3 and all the other even-numbered row photosensor sites are as shown in FIG. 1b of aforesaid copending application Ser. No. 357,760, now abandoned. Hence the electrons from all photosensor sites in the even-numbered rows move to the right and into the respective adjacent vertical shift register cells.

At time T11, when $1\phi V1$ goes high and $1\phi V2$ goes low, all rows of electron charge packets in the vertical shift registers move upward one row from the even-numbered row cells to the odd-numbered row cells.

At time T12, the electron charge packets move from the vertical shift register cells of row 1 up into cells H1 of the horizontal shift register whose voltage $1\phi H1$ is high and, at time T13, when the horizontal clock pulses are started again, the charge packets move along the horizontal shift register to its output and out to the external video circuit. In this way, line-by-line, all charge packets from all the even-numbered rows of elements are moved upward to the horizontal shift register and along it and out until the entire 50 rows of the even-numbered field of CCAID 100 have been read out. The entire foregoing cycle for reading out the odd- and even-numbered rows of CCAID 100 then repeats continuously. As explained earlier, the operation of CCAID 101 is accomplished similarly except for phasing.

Figure 6:
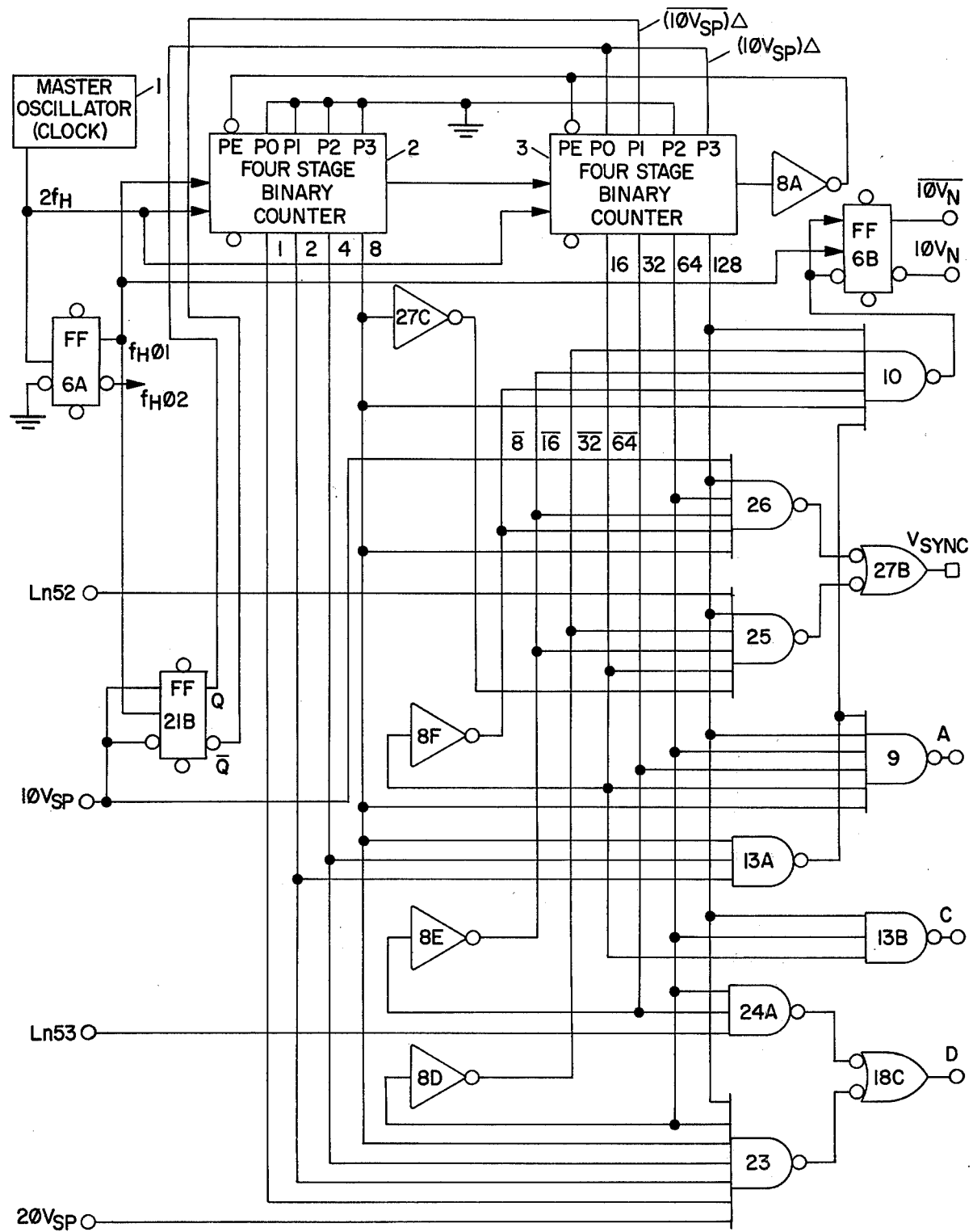
FIG. 6 is a schematic diagram of an element counter and decoder unit constituting one component of the combinational logic unit of FIG. 1.
Figure 6A:
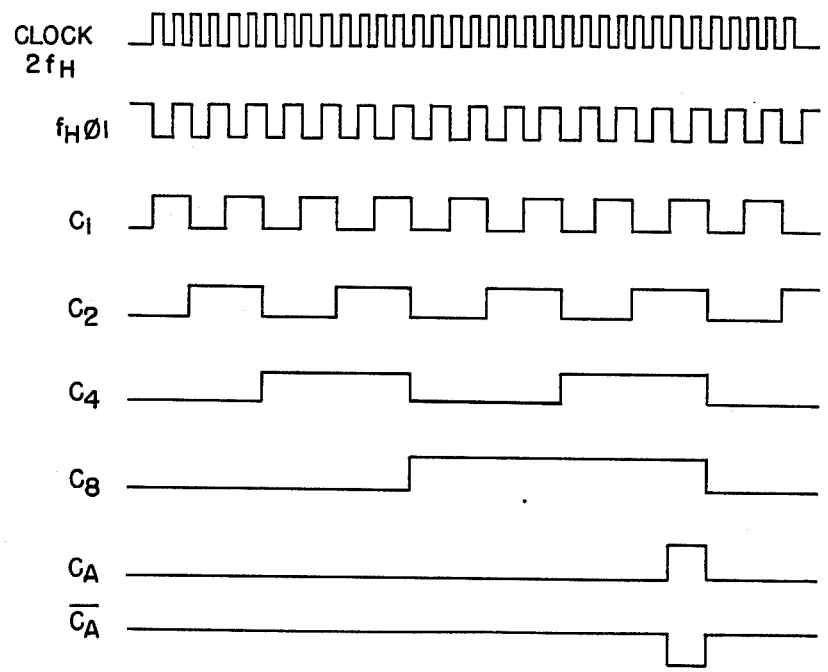
FIG. 6A comprises a representation of a series of signal waveforms generated by the counter unit of FIG. 6.

Referring now to FIG. 6, there is represented an element counter and decoder unit constituting one component of the combinational logic unit 105 of FIG. 1. This unit generates the signal $1\phi V_N$ used in generating the signals $1\phi V1$ and $1\phi V2$ for operating the vertical shift registers 203 of FIGS. 2 and 3 and a vertical sync signal V-sync for controlling the scanning waveforms of a television type display device, as well as a number of intermediate signals utilized in other components of the combinational logic unit, as described hereinafter. This unit includes a master oscillator 1 which develops an output pulse wave of a frequency $2f_H$, that is, twice the horizontal clocking frequency. This signal is applied to a flip-flop 6A which is preferably of the JK type, as are the other flip-flops referred to hereinafter. Such a flip-flop is illustrated in FIG. 5 of U.S. Pat. No. 3,586,953, to Markkanen et al., and described at column 5, lines 68 et seq. of that patent. Flip-flop 6A is operated in the toggle mode, producing two square-wave signals of opposite phase and of clock frequency, i.e., $f_H\phi 1$ and $f_H\phi 2$. The signals $f_H\phi 1$ and $2f_H$ are applied to a four-stage binary counter 2, the outputs of which are the counts 1, 2, 4, and 8, as indicated and as illustrated in FIG. 6A. In that figure, the Curves C1, C2, C4, and C8 represent the outputs of the four stages of counter 2 while the Curve $C_A$ shows the AND signal combination of the 4 count signals and Curve $\overline{C_A}$ shows the NAND signal combination of the 4 count signals.

The output stage of counter 2 is connected to the input of a second similar counter 3, to which is also applied the clock or timing signal $2f_H$. The output stages of counter 3 develop the counts of 16, 32, 64, and 128. Control signals $\overline{(1\phi V_{sp})}\Delta$ and $(1\phi V_{sp})\Delta$ are applied to the counter 3 for purposes described hereinafter. Each of the counters 2 and 3 may be of the type commercially available as Fairchild Model 9316 Counter and described in Fairchild TTL/MSI 9310 · 9316 BCD DECADE COUNTER/4-BIT BINARY COUNTER — Data Sheets and Fairchild 9310/93L10 and 9316/93L16 COUNTERS — Application Notes, both Copyright 1973. Counters 2 and 3 are designed so that they count only when all enable signals are in the active high state. The horizontal clocking signal $f_H\phi 1$ enables the first stage of counter 2 so that it counts only on alternate positive pulses of the oscillator signal $2f_H$. Counter 3 commences counting only when counter 2 has reached its terminal count state. A terminal count output is provided when both counters have reached binary counts of all 1s, which correspond to a count of 255. To cause the counter to count to a particular number, the counter is preset to the difference between the terminal count and the number to which the counter is to count plus 1. In this case, it is desired that the counters normally count to 224. To realize this, they are preset to 32. At the end of the 224th count, the terminal count is applied via inverter 8A to preset the counters back to 32 and initiate the next counting cycle. The four input leads, $P_0$, $P_1$, $P_2$, $P_3$, of counter 2 are all connected in parallel to ground. The input leads of counter 3 are connected as follows. Leads $P_0$ and $P_3$ are connected to lead Q of flip-flop 21b. Lead $P_1$ is connected to lead $\overline{Q}$ of flip-flop 21b. Lead $P_2$ is connected to ground. In normal operation, at the time counters 2 and 3 reach their terminal count (255), lead Q of flip-flop 21B is at a level representing a logical 0 and lead $\overline{Q}$ is at a level representing a logical 1. Thus, the eight parallel input leads of the counters 2 and 3 are in the logical states 00100000, which is the binary number representing 32. During the terminal count interval, the output pulse is applied via inverter 8A to the terminals PE of counters 2 and 3. At the leading edge of the next clock pulse ($2f_H$), the internal counter circuits assume the states representing the aforementioned binary number which has been set up on the parallel input leads and, hence, the element counter is preset to the number 32.

Figure 10:
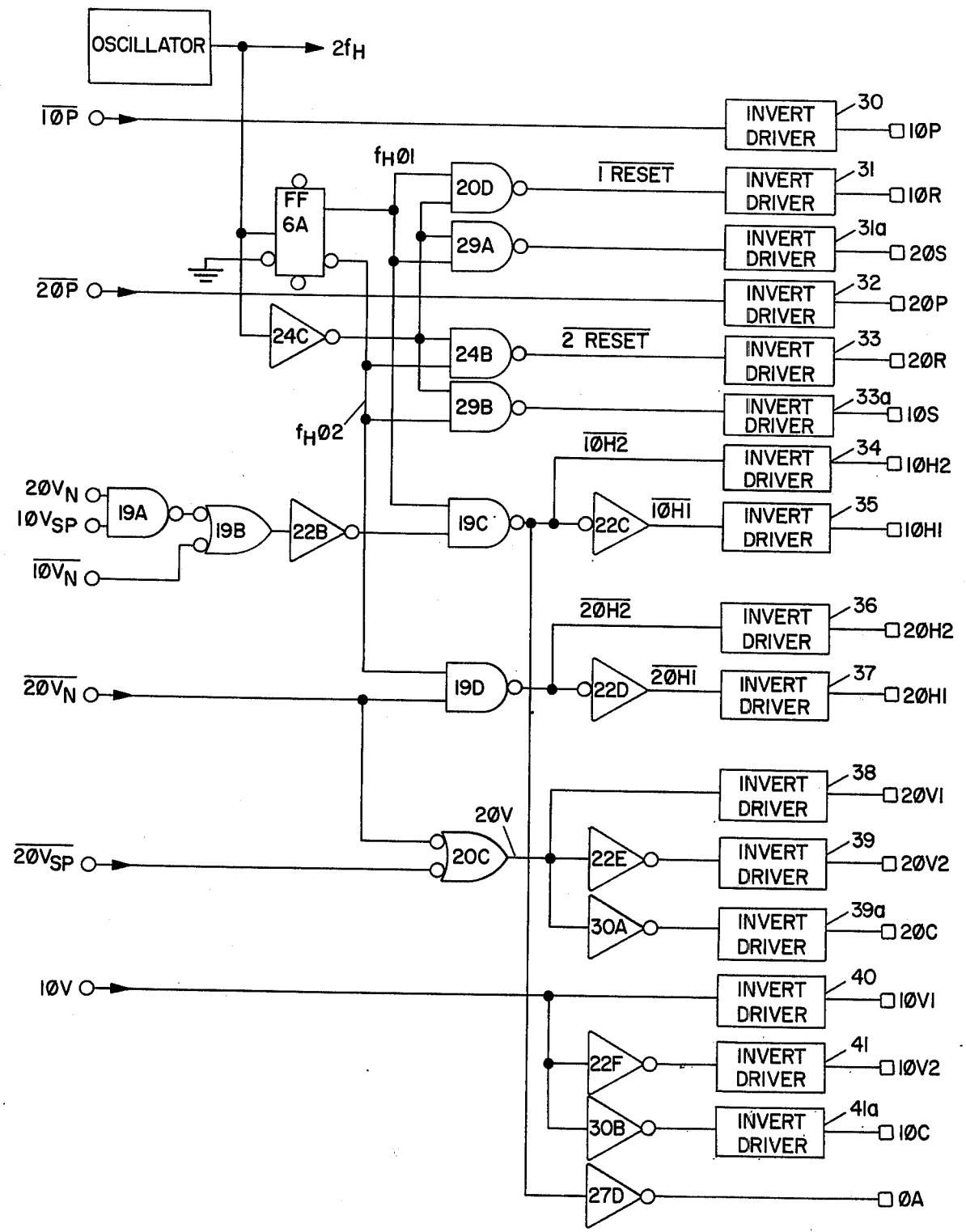

The logic circuit of FIG. 6 is effective to develop the signal $1\phi V_N$ for controlling the normal vertical scanning cycle of the CCAID 100. This signal is developed by NAND gate 10, to which are applied the count signals 8 and 128 directly from counters 2 and 3, respectively, and count signals $\overline{16}$, $\overline{32}$, and $\overline{64}$ from counter 3 via inverters 8F, 8E, and 8D, respectively. Gate 10 also receives the count signal $\overline{2\cdot 4\cdot 8}$ from counter 2 via NAND gate 13A. The output of gate 10 is applied to two input terminals of flip-flop 6B, to which is also applied the clock signal $f_H\phi 1$ to provide proper phasing, producing output signals $\overline{1\phi V_N}$ and $1\phi V_N$, the waveform of the latter being shown in FIG. 7 which shows waveforms of the essential signals utilized in timing and controlling the CCAIDs 100 and 101. In FIG. 10 et seq., output terminals which furnish final signals for use in controlling the CCAIDs, or the display device, are shown as squares while those terminals which furnish intermediate signals are shown as circles.

Figure 7:
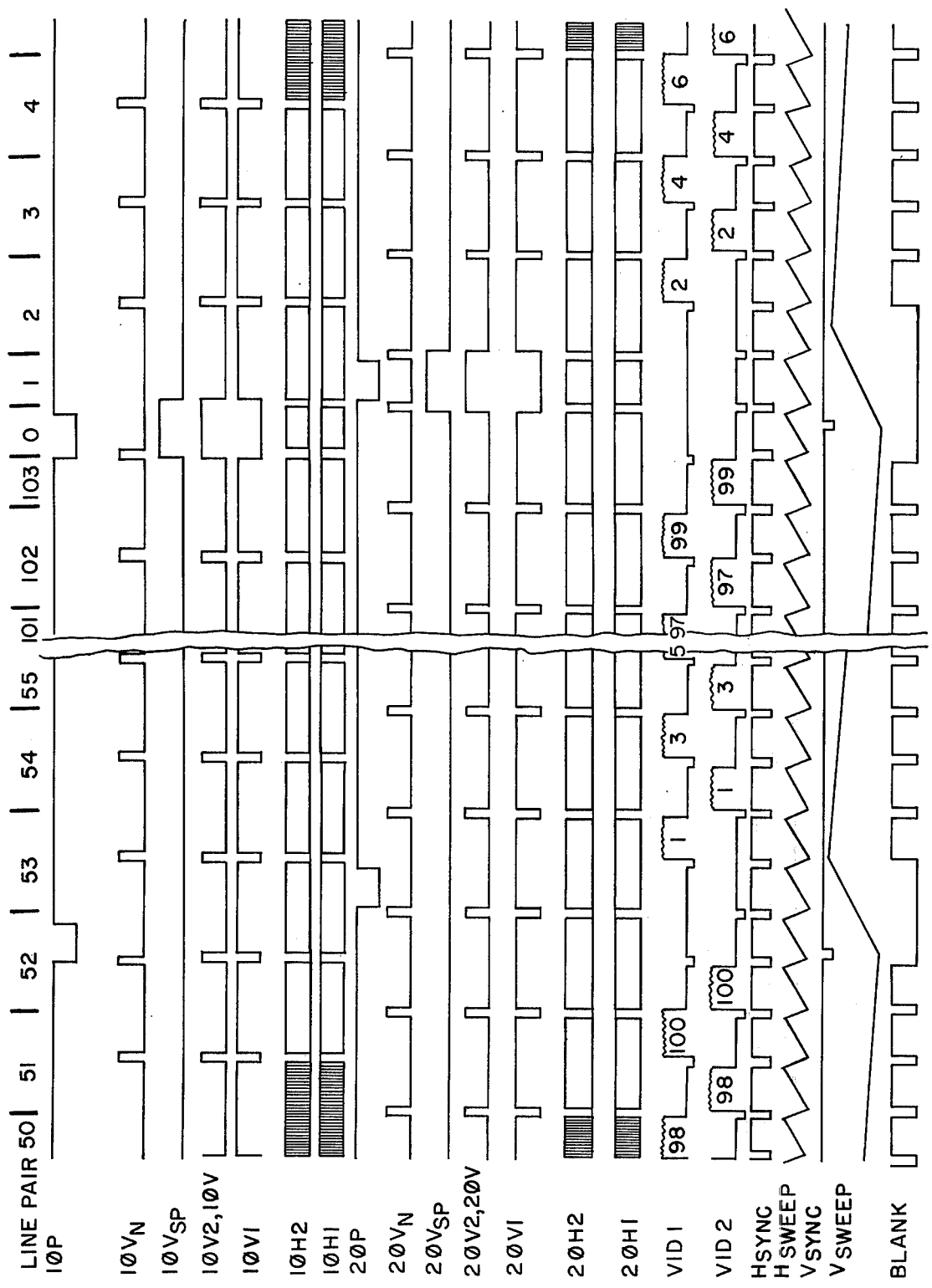
FIG. 7 comprises a representation of a series of waveforms representing output signals and the timing and the timing and control signals for controlling each of the area-image-sensing devices of FIG. 1.

The vertical sync pulses $V_{sync}$ are generated by the inverted input OR gate 27B. In accordance with conventional television practice, where 2:1 interlaced operation is to be employed, a complete frame consisting of the two aforementioned fields (odd-line and even-line) contains an odd number of horizontal line scanning periods — in this case 205. The timing of the $V_{sync}$ pulses is critical since, in combination with the $H_{sync}$ pulses, these signals act to produce the necessary offset in the odd-numbered and even-numbered vertical sweep waves. As shown in FIG. 7, there are two $V_{sync}$ pulses per frame, one occurring during line pair 52 and the other during line interval 0. During line pair 52, the $V_{sync}$ pulse must start in coincidence with the end of an $H_{sync}$ pulse. The $V_{sync}$ pulse occurring during line interval 0 starts half-way between the ends of two adjacent horizontal sync pulses. Since the ends of the horizontal sync pulses correspond to specific counts, the vertical sync pulse that occurs between them can also be generated by a specific count. Specifically, NAND gate 26 has as its inputs the signals $1\phi V_{sp}$, count signals 64 and 128 directly from counter 3, count signals $\overline{16}$ and $\overline{32}$ via inverters 8F and 8E, respectively, and count 8 directly from counter 2. The output of gate 26 is a pulse 8 elements in duration. Again, NAND gate 25 has as its inputs the Ln52 count signal, count signals 16 and 128 directly from counter 3, count signals $\overline{32}$ and $\overline{64}$ via inverters 8E and 8D, respectively, and count signal $\overline{8}$ via inverter 27C. The output of gate 25 is also a pulse of 8 elements in duration. The outputs of gates 25 and 26 are applied to an inverted input OR gate 27B which produces the signal $V_{sync}$ shown in FIG. 7.

Again, NAND gate 9 receives the signal $\overline{2\cdot 4\cdot 8}$ from counter 2 via NAND gate 13A, count signals 16, 32, 64, and 128 directly from counter 3, and count signal 8 directly from counter 2. Gate 9 develops in its output a signal A, seven element counts wide, which ends as the element counter is reset. NAND gate 13B receives count signals 16, 64, and 128 directly from counter 3, developing an output signal $\overline{16\cdot 64\cdot 128}$, signal C, to terminate the signal $1\phi P$ as described later. Similarly, the inverted-input NOR gate 18C receives a signal $\overline{32\cdot 64\cdot Ln53}$ via NAND gate 24A and a signal $\overline{1\cdot 2\cdot 4\cdot 8\cdot 64\cdot 128\cdot 2\phi V_{sp}}$ via NAND gate 23, the resultant signal D being utilized to terminate the signal $2\phi P$ as described hereinafter.

Figure 8:
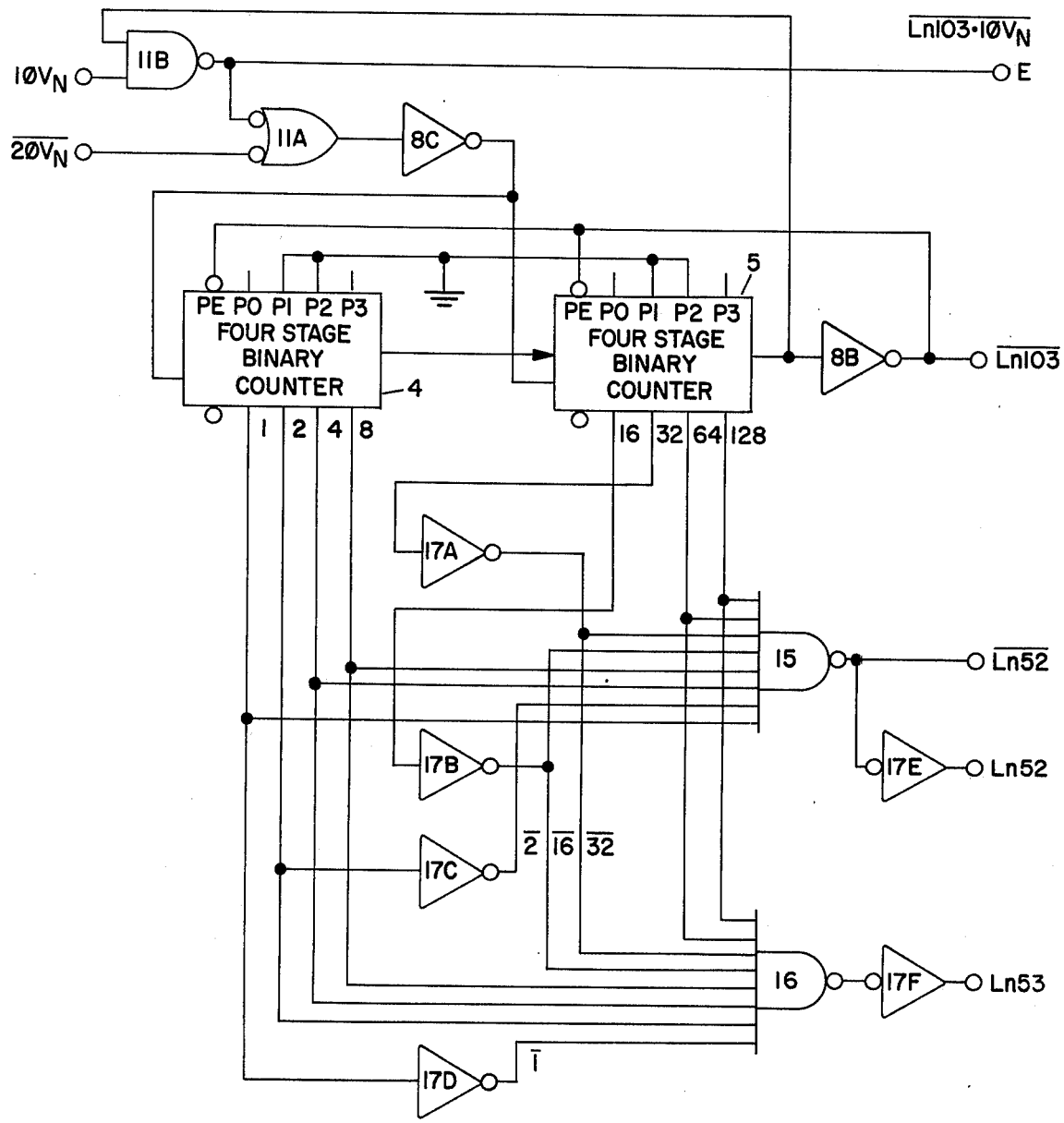
FIG. 8 is a schematic diagram of a line counter and decoder unit constituting one component of the combinational logic unit of FIG. 1.

Refer now to FIG. 8 which constitutes a schematic diagram of a counter and decoder unit, another component of the combinational logic unit 105 of FIG. 1, which generates a number of intermediate signals utilized in other components of the logic circuitry as described hereinafter. The inputs to the unit of FIG. 8 are the signal $1\phi V_N$ generated in the element counter and decoder unit of FIG. 6, as described above, and the signal $2\phi V_N$ generated as described hereinafter. The counter of FIG. 8 comprises two four-stage binary counters 4 and 5 in combination and is referred to hereinafter as the line-pair counter since, in normal operation, the time interval between each count is equal to the time interval required for a pair of display scan lines consisting of the video readout from a row of CCAID 100 and a row of CCAID 101. Since counters 4 and 5 together count to 256 whereas a count of only 103 is desired, before each counting cycle the counters are preset to 153 so that their final count is 256 minus 153 or 103. The input terminals $P_1$ and $P_2$ of counter 4 and the input terminals $P_1$ and $P_2$ of counter 5 are all connected in parallel to ground. Leads $P_0$ and $P_3$ of both counters are left open. In normal operation, at the time counters 4 and 5 reach their terminal count (255) the grounded leads are at a level representing a logical 0 and the ungrounded leads are at a level representing a logical 1. Thus the eight parallel input leads of the two counters (4 and 5) are in the logical state 10011001 which is the binary number representing 153. During the terminal count interval, the output pulse is applied via inverter 8B to the terminals PE of counters 4 and 5. At the leading edge of the next clock pulse, the internal counter circuits assume the states representing the aforementioned binary number, which has been set up on the parallel input terminals, and hence the line-pair counter is preset to the number 153.

All of the counts referred to hereinafter with respect to FIG. 8 are with reference to the starting count of 153. Thus the final count of counter 5 is 103 and, at this count, the output signal is fed back via inverter 8B to each of the counters 4 and 5 to initiate a succeeding counting cycle. The final count signal Ln103 is applied to inverter 8B to develop a signal $\overline{Ln103}$, an intermediate signal utilized as described hereinafter. Similarly, the count signal $\overline{Ln52}$ is derived from NAND gate 15, the inputs of which are the count signals 64 and 128 directly from counter 5, the count signals $\overline{32}$ and $\overline{16}$ from counter 5 via inverters 17A and 17B, respectively, count signals 1, 4, and 8 directly from counter 4, and count signal $\overline{2}$ from counter 4 via inverter 17C. The count signal Ln52 is derived from the output of gate 15 via inverter 17E. Again, the count signal $\overline{Ln53}$ is derived from NAND gate 16, the inputs of which constitute the count signals 64 and 128 directly from counter 5, the count signal $\overline{32}$ from counter 5 via inverter 17A, the count signal $\overline{16}$ from counter 17B, the count signals 2, 4, and 8 directly from counter 4, and the count signal $\overline{1}$ from counter 4 via inverter 17D. The count signal Ln53 is derived from the output of NAND gate 16 via inverter 17F.

The line-pair counter of FIG. 8 is advanced whenever CCAID 101 completes a vertical transfer. In the interval of the 103rd pair, the line counter must be operated by a different clock to achieve the half-line pair desired for interlaced scanning of the CCAIDs. This is accomplished in NAND gate 11B, the inputs of which are the line count signal Ln103 and the vertical clock signal $1\phi V_N$. The output of gate 11B is also combined with the signal $\overline{2\phi V_N}$ in inverted input OR gate 11A and then applied to the line-pair counter through the inverter 8C. Specifically, the signal $1\phi V_N$ and the final count signal Ln103 are applied to the gate 11B so that the output signal E is $\overline{Ln103 \cdot 1\phi V_N}$. The latter signal and the signal $\overline{2\phi V_N}$, developed as described hereinafter, are applied to the inverted input OR gate 11A, the output of which is applied to an inverter 8C which develops signal $\overline{2\phi V_N} + \overline{Ln103 \cdot 1\phi V_N}$, which is applied as a timing signal to the counters 4 and 5.

Figure 9:
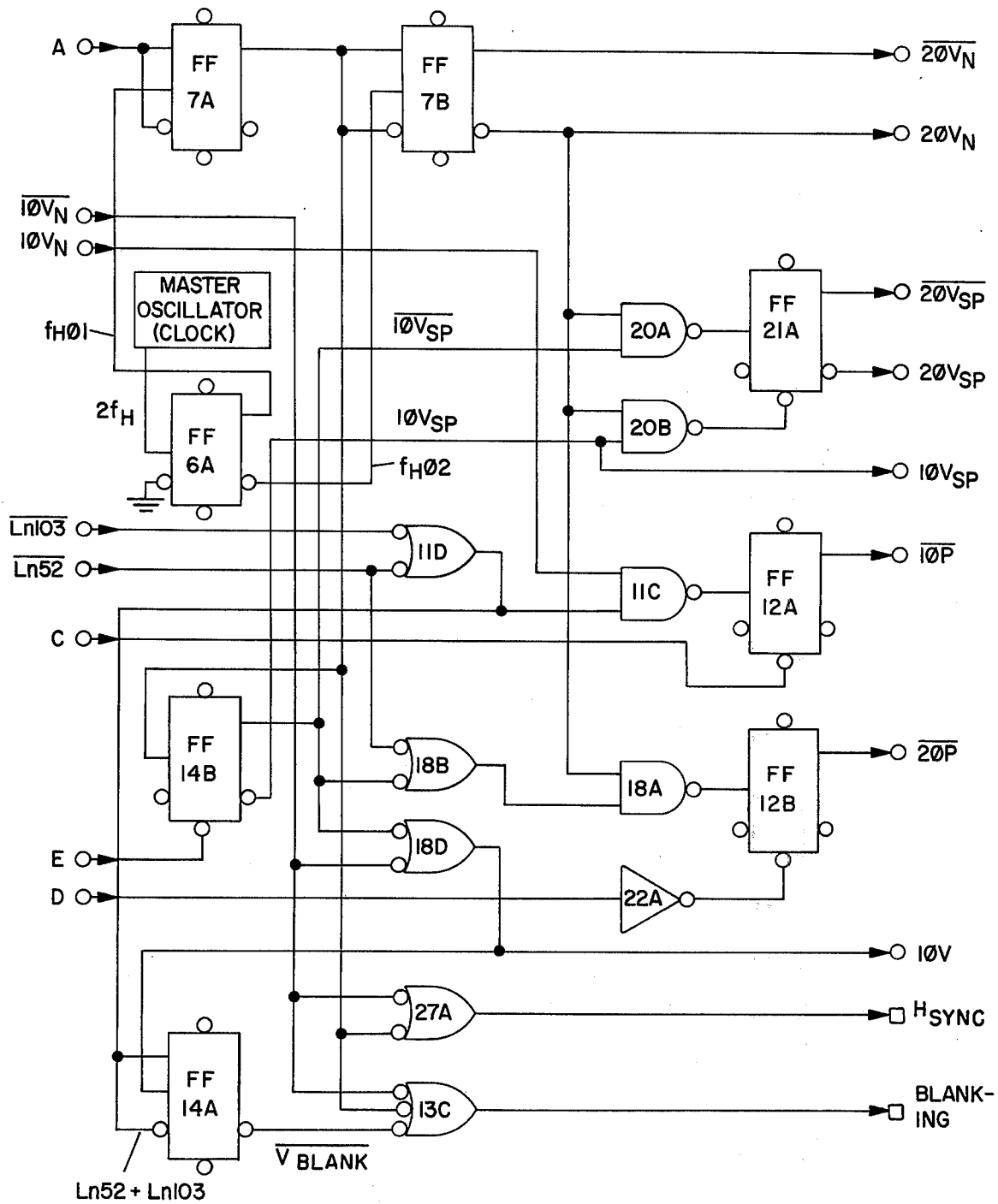
FIGS. 9 and 10 are schematic diagrams of additional components of the combinational logic unit of FIG. 1.

FIG. 9 is a schematic circuit diagram of certain basic logic circuitry forming a component of the logic unit 105 of FIG. 1. For convenience, the master oscillator 1 and the flip-flop 6A shown in FIG. 6 are duplicated in FIG. 9, although it is understood that only one of each is included in the combinational logic unit 105 and the description of these units need not be repeated here.

The signal A from FIG. 6, which is a basic seven-count long pulse, is applied to flip-flops 7A and 7B in cascade in which the proper phasing of the pulses $2\phi V_N$ and $\overline{2\phi V_N}$ is established by the application of the clock signal $f_H\phi 2$ to the flip-flop 7B.

For both of the CCAIDs there is a break in the normal clocking pattern for the vertical shift-register clocks. This occurs in what is designated as the line intervals 0 and 1. To obtain these variations in waveform, signals designated as $1\phi V_{sp}$ and $2\phi V_{sp}$ are generated once per frame and are ORed with the $1\phi V_N$ and $2\phi V_N$ clocking pulses. The signal $1\phi V_{sp}$ is initiated in flip-flop 14B by applying the signal E of FIG. 8 to the "clear" input terminal. The $1\phi V_{sp}$ signal is then terminated by clocking the flip-flop 14B with the output of flip-flop 7A. The signal $\overline{1\phi V_{sp}}$, also generated in flip-flop 14B as described, is then ORed with the signal $\overline{1\phi V_N}$ in the inverted input OR gate 18D, producing the vertical transfer signal $1\phi V$ which is similar to the signal $1\phi V2$, as shown in FIG. 7. Similarly, the signals $\overline{2\phi V_{sp}}$ and $2\phi V_{sp}$ are generated in flip-flop 21A. This flip-flop is set by NAND gate 20A by coincidence of the signals $\overline{1\phi V_{sp}}$ and $2\phi V_N$. It is then cleared by the arrival of the next $2\phi V_N$ signal and the $1\phi V_{sp}$ signal via NAND gate 20B.

Referring back to FIG. 6, since operation of the system in a 2:1 interlace mode is desired, there must be an odd number of horizontal display line-time intervals during each frame time. For this example, a frame time has been selected to consist of 205 horizontal time intervals. In its normal operation, the element counter of FIG. 6 counts 224 cycles of the $f_H\phi 1$ clock signal, which is equivalent to the duration of two horizontal display line-time intervals or a line pair. Therefore, once each frame time, the element counter must be operated to count 112 cycles of the $f_H\phi 1$ clock signal, which is equivalent to the duration of just one horizontal display line-time interval. This is made to take place during the line interval 1. It is accomplished by causing the counter to be preset to the number 144 at the end of the line interval 0. It then counts 112 cycles of the $f_H\phi 1$ clock signal during the line interval 1 to reach its terminal count of 255, at which time it resumes its normal pattern of recycling by presetting to 32. The counter is made to preset to 144 at the end of the line interval 0 by utilization of the $1\phi V_{sp}$ signal delayed through flip-flop 21B, since the $1\phi V_{sp}$ signal occurs only during line interval 0. As described previously, the four input terminals $P_0$, $P_1$, $P_2$, $P_3$ terminal of counter 2 are all connected in parallel to ground. Input terminals $P_0$ and $P_3$ of counter 3 are connected in parallel to output lead Q of flip-flop 21B. Terminal $P_1$ of counter 3 is connected to output lead $\overline{Q}$ of flip-flop 21B while its terminal $P_2$ is connected to ground. Signal $1\phi V_{sp}$, obtained from flip-flop 14B of FIG. 9, is applied to the J and K input terminals of flip-flop 21B (FIG. 6). Signal $f_H\phi 1$, from flip-flop 6A, is applied to the CP input terminal of flip-flop 21B. Slightly before the start of line interval 0, $1\phi V_{sp}$ goes high and, on the next pulse of the $f_H\phi 1$ signal, output Q of flip-flop 21B goes high and output $\overline{Q}$ goes low. The flip-flop remains in this state throughout line interval 0. When signal $1\phi V_{sp}$ goes low again, near the end of the line interval 0, the next pulse of $f_H\phi 1$ (which occurs after the end of line interval 0) causes flip-flop 21B to clear, with output Q going low and output $\overline{Q}$ going high. Thus the signal $(1\phi V_{sp})\Delta$ is generated at output Q and $(\overline{1\phi V_{sp}}) \Delta$ is generated at output $\overline{Q}$. Therefore, when the element counter consisting of counters 2 and 3 reaches its terminal count in line interval 0, output lead Q of flip-flop 21B and hence input terminals $P_0$ and $P_3$ of counter 3 are high and output lead $\overline{Q}$ of flip-flop 21B and input terminal $P_1$ of counter 3 are low. Thus the eight input terminals of counters 2 and 3 are in the logical state 10010000, which is the binary number representing 144. During the terminal count interval, the output pulse is applied via inverter 8A to the parallel enable terminals PE of counters 2 and 3. At the leading edge of the next clock pulse $2f_H$, the internal counter circuits assume the states representing the aforementioned binary number which has been set up on their input terminals and, hence, the element counter is preset to the number 144.

The timing diagram of FIG. 7 shows that the horizontal clocks for both CCAIDs are continuous except in the vertical transfer period, the only break in the normal pattern occurring during the line intervals 0 and 1. The horizontal clocks for both CCAIDs are derived directly from the clock signals $f_H\phi 2$ developed by flip-flop 6A (FIG. 6). For CCAID No. 2, the horizontal clock is inhibited only by the $2\phi V_N$ pulse, as described hereinafter. For CCAID No. 1, the inhibiting required is more complex, as described hereinafter.

The timing diagram of FIG. 7 shows that for each CCAID there are two phototransfer pulses $\phi P$ in a frame. This is necessary since the CCAIDs operate in an interlaced mode, as described above, in which each produces one field for each phototransfer, one field consisting of all odd-numbered lines and the other of all even-numbered lines. The first phototransfer pulse φP occurs during the line interval 0. For CCAID No. 1, the first phototransfer pulse 1φP occurs at the beginning of the line interval 0 while for CCAID No. 2, the first phototransfer pulse 2φP occurs during the line interval 1. The second phototransfer pulse 1φP for CCAID No. 1 occurs in the second half of the line-pair 52 while the second phototransfer pulse 2φP for CCAID No. 2 occurs at the beginning of line-pair 53.

The logic implementation of the phototransfer pulse 1φP for CCAID No. 1 is based on the fact that that pulse always begins at the trailing edge of a 1φV$_N$ pulse. To this end, the signals $\overline{Ln52}$ and $\overline{Ln103}$ are applied to inverted input OR gate 11D (FIG. 9), the output of which is applied to NAND gate 11C which normally inhibits the generation of 1φP pulses except during the line 52 and the line 103 intervals. At this time, the output of gate 11D permits the 1φV$_N$ pulse to pass through NAND gate 11C. The resultant signal $\overline{1\phi V_N \cdot (Ln52 + Ln103)}$ is applied to flip-flop 12A which develops the 1φP signal. When the $\overline{1\phi V_N \cdot (Ln52 + Ln103)}$ signal transitions from a 0 to a 1, this is the beginning of a phototransfer pulse for CCAID No. 1. The circuitry may be designed so that the 1φP pulse, and consequently the $\overline{1\phi P}$ pulse, has a duration of 64 elements. When the signal C (FIG. 6) goes to a logic 0, flip-flop 12A is reset and the complement of the phototransfer pulse $\overline{1\phi P}$ ends.

The generation of the 2φP pulse for CCAID No. 2 is generally similar to that of the 1φP pulse. The timing waveforms of FIG. 7 show that the 2φP pulse is always initiated at the trailing edge of the 2φV$_N$ pulse. The logic circuitry therefore selects the 2φV$_N$ pulses that occur at the end of line-pair 52 and the end of line interval 0. The $\overline{Ln52}$ pulses and the $\overline{1\phi V_{sp}}$ pulses are applied to the inverted input OR gate 18B, the output of which, together with the signal 2φV$_N$, are applied to NAND gate 18A, the output of which is applied as a clock to flip-flop 12B. Again, the duration of the 2φP pulse has been selected as 64 elements. Specifically, flip-flop 12B is timed by signal D (FIG. 6) applied to the flip-flop via inverter 22A to develop the complement of the phototransfer signal $\overline{2\phi P}$, 64 elements wide.

In addition to the clocking signals necessary actually to operate the CCAIDs, additional timing signals are required. These are the blanking signals for the display and the horizontal and vertical sync signals which are used to generate the display sweep signal. The generation of the vertical sync signal has been described above in connection with FIG. 6. A single composite blanking signal is produced which is based upon both vertical and horizontal timing and is a combination of two horizontal and one vertical blanking signal. The two horizontal blanking signals correspond to the vertical transfer times of the two CCAIDs. Vertical blanking is required once for each of the two fields making up a frame. The two vertical blanking intervals are of different durations in order to accommodate the half-line offset to provide the interlaced display. The odd-numbered field display is unblanked at the beginning of the readout of row 1 of CCAID No. 1 while the even-numbered field display is unblanked at the beginning of the readout of row 2 of CCAID No. 1. The composite blanking signal is shown in FIG. 7. The vertical blanking interval in the vicinity of line-pairs 52 and 53 is the narrower of the two since it is followed by the odd-numbered field. This vertical blanking interval starts at the beginning of the pulse 1φV in line 52 and ends at the beginning of the 1φV pulse of line 53. The waveform of 1φV is similar to that of 1φV2 shown on FIG. 7. The vertical blanking interval occurring in the vicinity of line interval 0 is the longer one since it is followed by an even-numbered field. It is initiated by the leading edge of pulse 1φV$_N$ occurring in line-pair interval 103 and ends with the leading edge of 1φV$_N$ occurring during line-pair interval 2. To generate the vertical blanking pulses, the Ln52 or Ln103 pulse output of the inverted input OR gate 11D (FIG. 9) is applied to both inputs of the flip-flop 14A which is clocked by the 1φV signal output of the OR gate 18D. The vertical blanking output $\overline{V_{BLANK}}$ of flip-flop 14A is ORed with the horizontal blanking pulses from flip-flop 7A and the $\overline{1\phi V_N}$ output from flip-flop 6B of FIG. 6 in the inverted input OR gate 13C, which forms the composite blanking pulse utilized in the display.

The horizontal synchronizing pulses are generated by the inverted input OR gate 27A. This signal consists of a synchronizing pulse for each horizontal line. To gate 27A are applied the output signal from flip-flop 7A and $\overline{1\phi V_N}$ from flip-flop 6B (FIG. 6). The horizontal sync pulses, as shown in FIG. 7, are coincident with the narrow blanking pulses.

FIG. 10 is a schematic diagram of driver circuits of the combinational logic unit 105 of FIG. 1 together with their immediately associated logic components. The details of the driver circuits themselves are set out below. The function of the driver circuits is to shift the level of the logic signals to the appropriate voltage levels required by the CCAIDs and to provide the necessary drive capability for the capacitive loads presented by the CCAIDs. That is, the drivers shift the levels of the logic signals and/or raise the power levels of the input signals to the CCAIDs without, however, modifying the timing or duration of the logic signals. Specifically, the complements of the phototransfer pulses $\overline{1\phi P}$ and $\overline{2\phi P}$ are applied directly to the drivers 30,32 respectively. Reset signals for the two CCAIDs are derived by selecting alternate negative half cycles of the 2f$_H$ signal. Specifically, the reset signal for CCAID 100, 1φR, is derived by applying the output of NAND gate 20D, whose inputs are f$_H$φ1 form flip-flop 6A and the 2f$_H$ signal via inverter 24C, to driver 31 whose output is the signal 1φR. These same two signals are applied via NAND gate 29A to a driver 31a to develop a sampling signal 2φS of the same waveform for CCAID 101. In a similar manner, the reset signal for CCAID 101, 2φR, is derived by applying the output of NAND gate 24B, whose inputs are f$_H$φ2 from flip-flop 6A and the 2f$_H$ signal via inverter 24C, to driver 33 whose output is the signal 2φR. These same two signals are also applied via NAND gate 29B to driver 33a to develop a sampling signal 1φS of the same waveform for CCAID 100. The waveforms of these signals for CCAID 100 are shown in FIG. 5.

The horizontal clock for CCAID No. 1 is normally inhibited by the signal 1φV$_N$. However, in the line interval 0, it must be inhibited by the 2φV$_N$ pulse. This is implemented by decoding the coincidence of the 2φV$_N$ and 1φV$_{sp}$ pulses in gate 19A. The resultant is then ORed with the signal $\overline{1\phi V_N}$ in the inverted input OR gate 19B to produce a signal which is applied via inverter 22B to the NAND gate 19C. NAND gate 19C is clocked by signal f$_H$φ1 to produce the signal $\overline{1\phi H2}$ which is applied to driver 34. The signal output of gate 19C is also applied to driver 35 via inverter 22C to develop the signal $\overline{1\phi H1}$ and to inverter 27D to develop the signal $\phi A$ of the same waveform as the signal $1\phi H2$ developed by driver 34. Similarly, the signal $\overline{2\phi V_N}$ is applied to NAND gate 19D which is clocked by the signal $f_h\phi 2$ to produce the signal $\overline{2\phi H2}$ which is applied to driver 36 to develop the horizontal transfer signal $2\phi H2$, while the signal $\overline{2\phi H2}$ is also applied to inverter 22D to produce the signal $\overline{2\phi H1}$ which is applied to driver 37 to develop the horizontal transfer signal $2\phi H1$.

Again, the signals $\overline{2\phi V_N}$ and $\overline{2\phi V_{sp}}$ are applied to the inverted input OR gate 20C to produce the signal $2\phi V$ which is applied to driver 38 to develop the vertical transfer signal $2\phi V1$. The signal $2\phi V$ is also applied via inverter 22E to driver 39 to develop the vertical transfer signal $2\phi V2$ and, via inverter 30A, to driver 39a to develop the clamp signal $2\phi C$ of the same waveform for CCAID 101.

Figure 11:
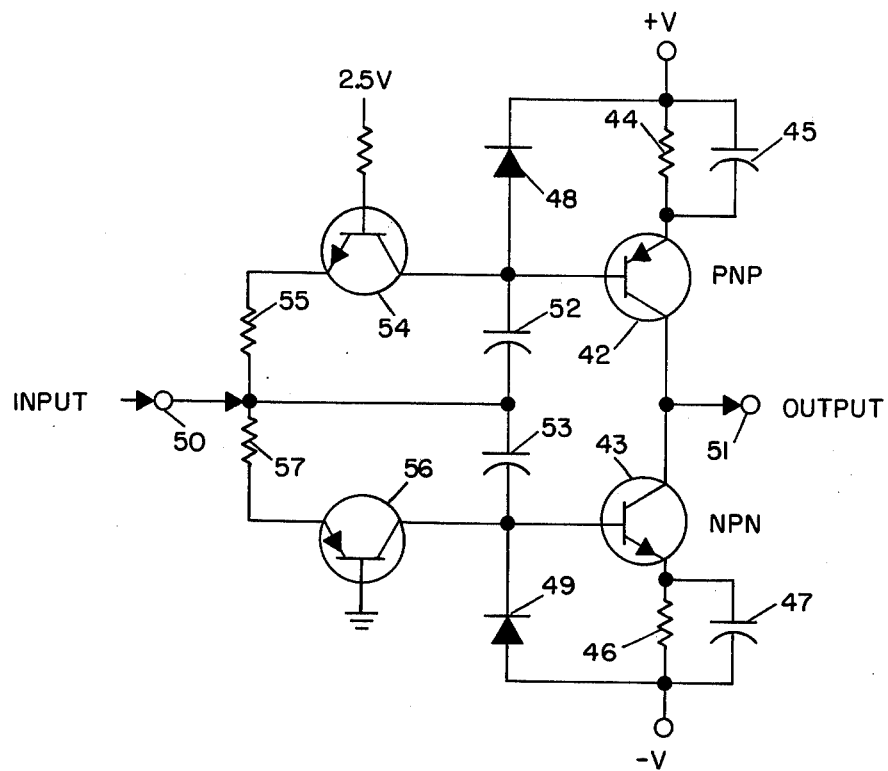
FIG. 11 is a schematic diagram of a driver circuit suitable for use as each of the driver circuits of FIG. 10.

Lastly, the signal $1\phi V$ is applied directly to driver 40 to develop the vertical transfer signal $1\phi V1$ and is also applied via inverter 22F to driver 41 to develop the signal $1\phi V2$ and, via inverter 30B to driver 41a to develop the clamp signal $1\phi C$ of the same waveform. Refer now to FIG. 11, which is schematic circuit diagram of a driver suitable for use as the drivers 30-41a of FIG. 10. This driver comprises a P-N-P transistor 42 and an N-P-N transistor 43 having their emitter-collector circuits connected in series across a voltage source $+V$, $-V$ which may be of the order of $\pm 15$ volts. In series with transistor 42 is a load circuit comprising resistor 44 and parallel by-pass capacitor 45. Similarly, in series with transistor 43 is a load circuit comprising resistor 46 and parallel by-pass capacitor 47. The base of transistor 42 is connected to terminal $+V$ through diode 48 while the base of transistor 43 is connected to the terminal $-V$ through a diode 49. Diode 48 acts to limit the positive excursion of the base voltage of transistor 42 to a maximum value not significantly more positive than $+V$. Similarly, diode 49 acts to limit the negative excursion of the base voltage of transistor 43 to a value not significantly more negative than $-V$. The output terminal 51 of the driver is connected in common to the collectors of transistors 42, 43.

The input signal to the driver from terminal 50 is AC coupled to the bases of transistors 42, 43 via capacitors 52, 53 respectively. The input terminal 50 is also DC coupled to the base of transistor 42 via a transistor 54 and resistor 55 in series and to the base of transistor 43 via transistor 56 and resistor 57 in series. As pointed out hereinafter, the DC coupling circuit just described may be omitted when the repetition rate of the input pulses is sufficiently high to be adequately coupled to the bases of the transistors by the capacitive coupling described.

The operation of the driver of FIG. 11 is, briefly, as follows. When the input terminal 50 goes positive, transistor 43 is turned on, effectively connecting the output terminal 51 to the supply terminal -V through resistor 46. When the polarity of the input terminal 50 changes and goes low, the transistor 43 is turned off and the transistor 42 is turned on, effectively connecting the output terminal 51 to the supply terminal $+V$ through resistor 44. The wave shape of the output signal at terminal 51 is the complement of the input wave shape and its voltage swing is determined by the supply voltage $+V$, $-V$ and a voltage drop across resistors 44, 46.

It is noted in FIG. 7 that the phototransfer pulses $1\phi P$ and $2\phi P$ and the vertical clocking pulses $1\phi V1$, $1\phi V2$, $2\phi V1$ and $2\phi V2$ have waveforms which include long intervals in which the output must remain either at the high state or the low state, thus requiring the DC coupling described above. However, in the case of the horizontal clocking signals, their repetition rate is sufficiently high that the DC coupling circuit is not required and may be omitted.

The output video information from each of the CCAIDs is in the form of a series of negative pulses whose amplitudes are proportional to the image illuminance at the successive photosensitive elements of the CCAID and whose repetition frequency is equal to $f_H$ as shown by the waveform 1S on FIG. 5. The signal also contains residual components of the reset signal $1\phi R$ which is not useful picture information. As shown in FIG. 1, the output 1S of CCAID 100 is coupled through inverting amplifier 1-106 and capacitor 1-107 to sample and hold circuit 1-108 and the output 2S of CCAID 101 is similarly coupled through inverting amplifier 2-106 and capacitor 2-107 to sample and hold circuit 2-108. Gains of the two amplifiers are controlled by the feedback resistor 1-107a and 2-107a, one of which, for example resistor 2-107a, may be adjustable in order to permit different gains in the two channels to compensate for any inequality in the sensitivities of the two CCAIDs or of the illuminances of the two images. A signal having the waveform of $1\phi S$, as shown in FIG. 5, is applied to sample and hold circuit 1-108. During the time signal $1\phi S$ is high, the sample and hold circuit acts to sense the instantaneous level of the input (the inverted 1S signal) and to retain the sensed level after signal $1\phi S$ returns to its low state. This action takes place repeatedly at intervals equal to the element readout interval, resulting in the sampled white positive video signal of waveform shown at Vid 1 in FIG. 5. This procedure eliminates the undesired residual component of reset pulses that are present in the original output signal 1S.

In order to establish a reference level for "black" in the output signal supplied to the display device, a clamping operation is performed analogous to the technique known as "DC restoration" in conventional television systems. Specifically, a signal having the waveform of $1\phi C$ (which incidentally is identical to waveform $1\phi V2$) as shown in FIG. 5, is applied to clamp circuit 1-109 shown on FIG. 1. During the interval that $1\phi C$ is high, the signal Vid 1 is lowest and represents "black" since it is timed to occur during a portion of the readout that does not include any image information. During this interval, the clamp circuit establishes a reference voltage level of a fixed value, for example zero volts DC, at the output of 1-109. When signal $1\phi C$ goes low again, the output is unclamped and is free to reproduce the input signal Vid 1. However, the output is a voltage varying as indicated in Vid 1 and where each instantaneous value represents a level referred to zero or "black". Since the clamping and reestablishment of the black reference takes place one for each line-pair, the time constants of the circuit are chosen so as to cause the reference level to remain substantially constant for the period between clamp operations.

Figure 12:
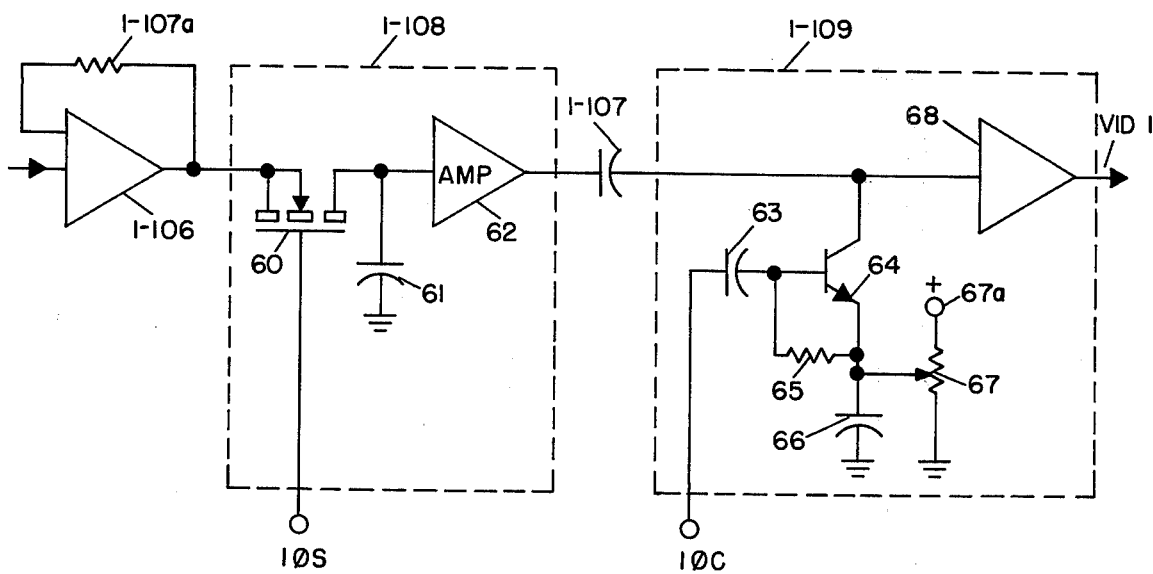
FIG. 12 is a schematic diagram of the sample and hold circuits and the clamping circuits of the system of FIG. 1.

Referring to FIG. 12, the sample and hold circuit 1-108 consists of a field effect transistor 60 coupled to the output of amplifier 1-106, duplicated from FIG. 1 for clarity, a capacitor 61, and an amplifier 62. Transistor 60 may be of the type presently available commercially as the Signetics "D-MOS Field Effect Transistor SD 210" and described in the data contained in the "Signetics Digital, Linear, MOS Data Book", Copywright 1974, as published by the Signetics Corporation, Sunnyvale, California. Transistor 60 acts as a near-ideal electronic switch which transfers signals from preamplifier 1-106 only when its gate electrode is raised from low to high by the action of applied control signal 1$\phi$S. During the interval when 1$\phi$S is high, the output signal from amplifier 1-106 charges capacitor 61 to a level corresponding to the average signal during the sampling period defined by the duration of the 1$\phi$S high condition. After the end of the sampling period, when 1$\phi$S returns to the low condition, transistor 60 is turned OFF. During OFF time periods, the previously sampled signal appearing on capacitor 61 is held at an essentially constant value since the discharge of 61 is inhibited by the relatively high input impedance of amplifier 62.

Clamping or "DC restoration" is effected by circuit 1-109 of FIG. 12. The sampled and held video signals from circuit 1-108 are coupled through capacitor 1-107 to buffer amplifier 68. Transistor 64 and its associated circuit elements 63, 65, 66, and 67 serve to act as a clamp switch which, when transistor 64 is turned "on", serves to establish an essentially constant signal voltage at the output of capacitor 1-107 corresponding to black or zero video signal. The action of transistor 64 is controlled by the clamp signal 1$\phi$C, FIG. 5, which is normally low except during the horizontal blanking interval. When 1$\phi$C is high, transistor 64 is turned ON, effectively connecting the output side of capacitor 1-107 to a DC voltage determined by a voltage divider connected to an input terminal 67a furnishing a DC level which may be of the order of +8 volts. As shown in FIG. 5, the high 1$\phi$C level occurs during the period after readout of CCAID video information, i.e. during the H blanking interval after charge-packet samples from the photosites of one line have been read out. The 1$\phi$C pulse goes LOW just before a new row of charge-packet signals is read out and remains low until the row is completely read out. During the 1$\phi$C low condition, transistor 64 is in the OFF or nonconducting state and the potential at the output of capacitor 1-107 is determined by the time-varying components of the signal capacitively coupled thereby. If time-varying components of signal are absent, as occurs when the scene image is black, the voltage at the input to buffer amplifier 68 is essentially at the level previously established by the setting of voltage divider 67, since the buffer 68 has a sufficiently high input impedance to inhibit discharge of the capacitor 1-107 during the intervals between high 1$\phi$C states.

Circuits 2-108 and 2-109 receive signals 2$\phi$S and 2$\phi$C and operate to perform similar functions on signal 2S, the output from CCAID 101, yielding as an output a waveform Vid 2 having characteristics similar to Vid 1.

The signals Vid 1 and Vid 2 are connected to the input terminals of the video combining amplifier 110 of FIG. 1. The video combining amplifier may be of the type commercially available as the Motorola Model MC 1545 Gate Controlled Two Channel Input Wideband Amplifier and described in Motorola Semiconductor Products, Inc. Linear Integrated Circuits Data Book, Third Edition, Nov. 1973, pages 8-274 to 8-279, Copyright 1973, and Application Notes AN-475 "Using the MC 1545, a Monolithic Gated Video Amplifier" and AN-491 "Gated Video Amplifier Applications — The MC 1545" published and distributed by Motorola Semiconductor Products, Inc.

Amplifier 110 is designed to accept video signals from the two input channels, providing a single output which is an amplified replica of either input signal in a time sequence determined by the input channel select pulse $\phi$A, FIG. 5.

Specifically, an amplified replica of the Vid 1 signal appears at the output when $\phi$A is high and an amplified replica of the Vid 2 signal appears at the output when $\phi$A is low.

During the time that a line of video information originating from CCAID 100 is to be displayed, it is desired that the video output waveform consist of a series of square-shaped pulses whose widths are equal to approximately one-half the $f_H$ signal period and whose amplitudes are proportional to the sample and hold signal levels represented as Vid 1 of FIG. 5. The video output level between the said pulses preferably should be the reference black level. A similar signal is desired for the information originating from CCAID 101 except that the phasing of the pulses is such that the information pulses in the lines from Vid 2 are displayed immediately below the spaces left in the previous lines from Vid 1. This may be achieved by applying a waveform $\phi$A (FIG. 5) identical to 1$\phi$H2 to the channel select input terminal of combining amplifier 110. Since during the time video information is obtained from Vid 1, the Vid 2 signal is at black level and vice versa, the control signal so generated produces the desired result.

Thus, the charge-coupled device video-signal-generating system of the invention, as described above, realizes a number of advantages over prior systems of this type using a single image sensor. The specific implementation described doubles the number of displayed picture elements and scan lines for each image-output frame. Aliasing, that is, spurious or false image-signal generation, which occurs with single area image arrays having nonphotosensitive patterned regions within the image format region, is reduced.

In another preferred embodiment of the invention, each device is positioned such that the photosensor sites of one device are offset only in the horizontal direction by one-half column space from the photosensor sites of the other device. It should be understood that in both embodiments the offset spacing is selected to locate photosensor sites of the second sensor at image points not accessed by the first sensor or not assessed by the first sensor during the same field readout interval.

In this embodiment of the invention, the configuration is such that the two area-image-sensing devices are positioned with respect to corresponding image points to have no offset to the vertical direction but to have one-half column offset in the horizontal direction. Thus those image points that fall on the vertical shift registers 203 (FIGS. 2 and 3) of CCAID 100 will fall on the columns of photosensor sites 200 of CCAID 101 and vice versa. Since, in this configuration, the similarly numbered rows of photosensor elements of each device sense the same horizontal lines of image detail, the video from the two devices should not be displayed in line sequence but, rather, during the same display line scan. However, since the image detail seen by one device is that detail occupying the spaces between the detail seen by the other device, the video signals making up each line should be composed of alternate elements from the corresponding row from each sensing device, interleaved to form a line containing twice as many image data samples as are obtained from one sensing device alone. Each field to be displayed will consist of 50 lines so that a full frame will consist of 100 active lines, each line consisting of 100 elements from each device, making a total of 200 image elements contained in each line of video signal. In order to allow time for vertical retrace and provide the timing to give 2:1 interlaced operation, a frame period is made equal to 105 horizontal line scan periods.

Figure 13:
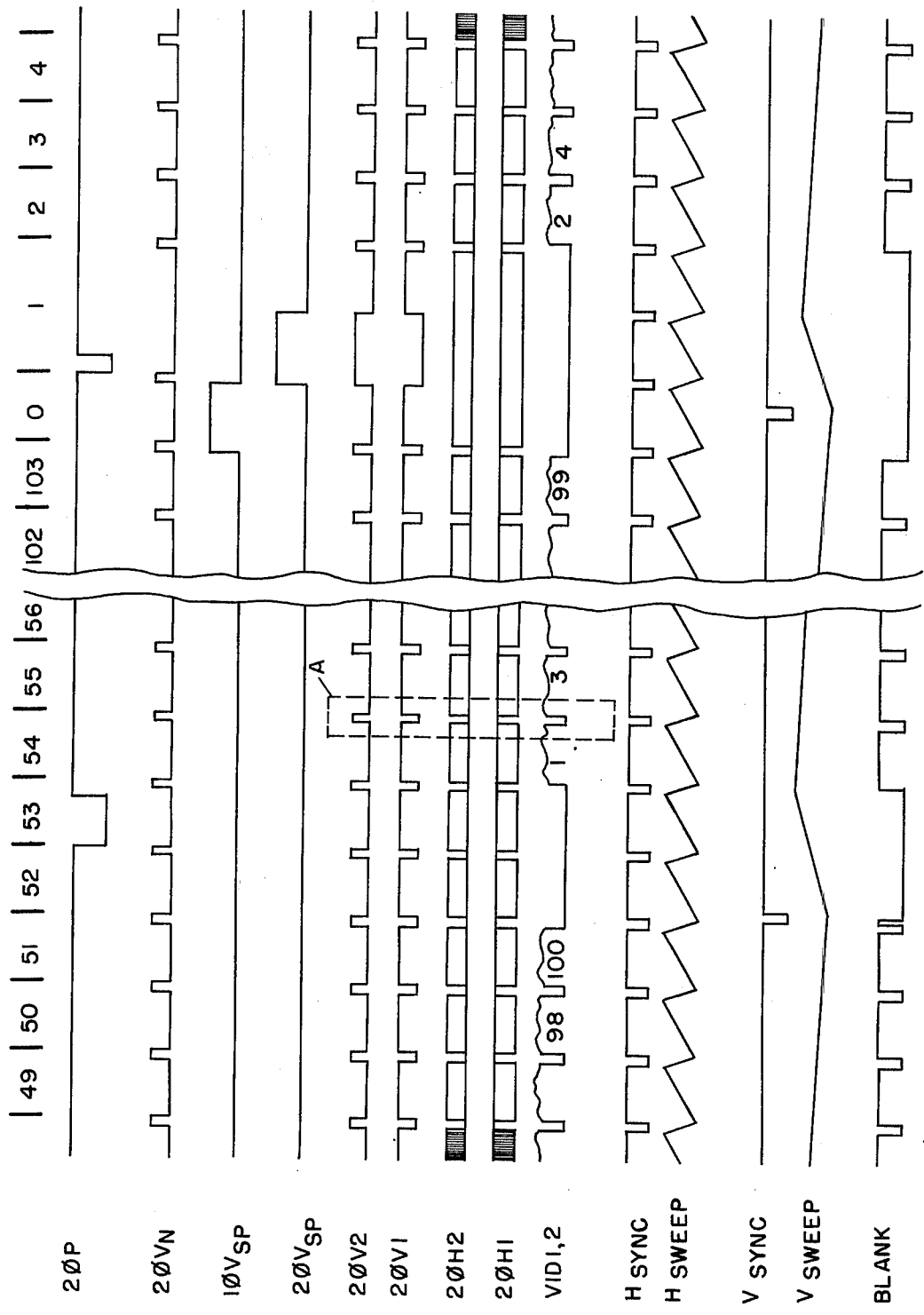
FIG. 13 is a series of waveforms representing output signals and timing and control signals for controlling each of the area-image-sensing devices of a system to operate in an alternate mode.

In FIG. 13 are shown a number of the waveforms required for operation of the two CCAID devices in this mode as well as the resulting video signal and signals required for scanning of the display tube. The figure shows a number of line periods near the end of the even-numbered field starting with line interval 49. After a break, it then shows several line periods near the end of the odd-numbered field, the ensuing blank and vertical retrace period and several line periods of the following (even-numbered) field.

Figure 14:
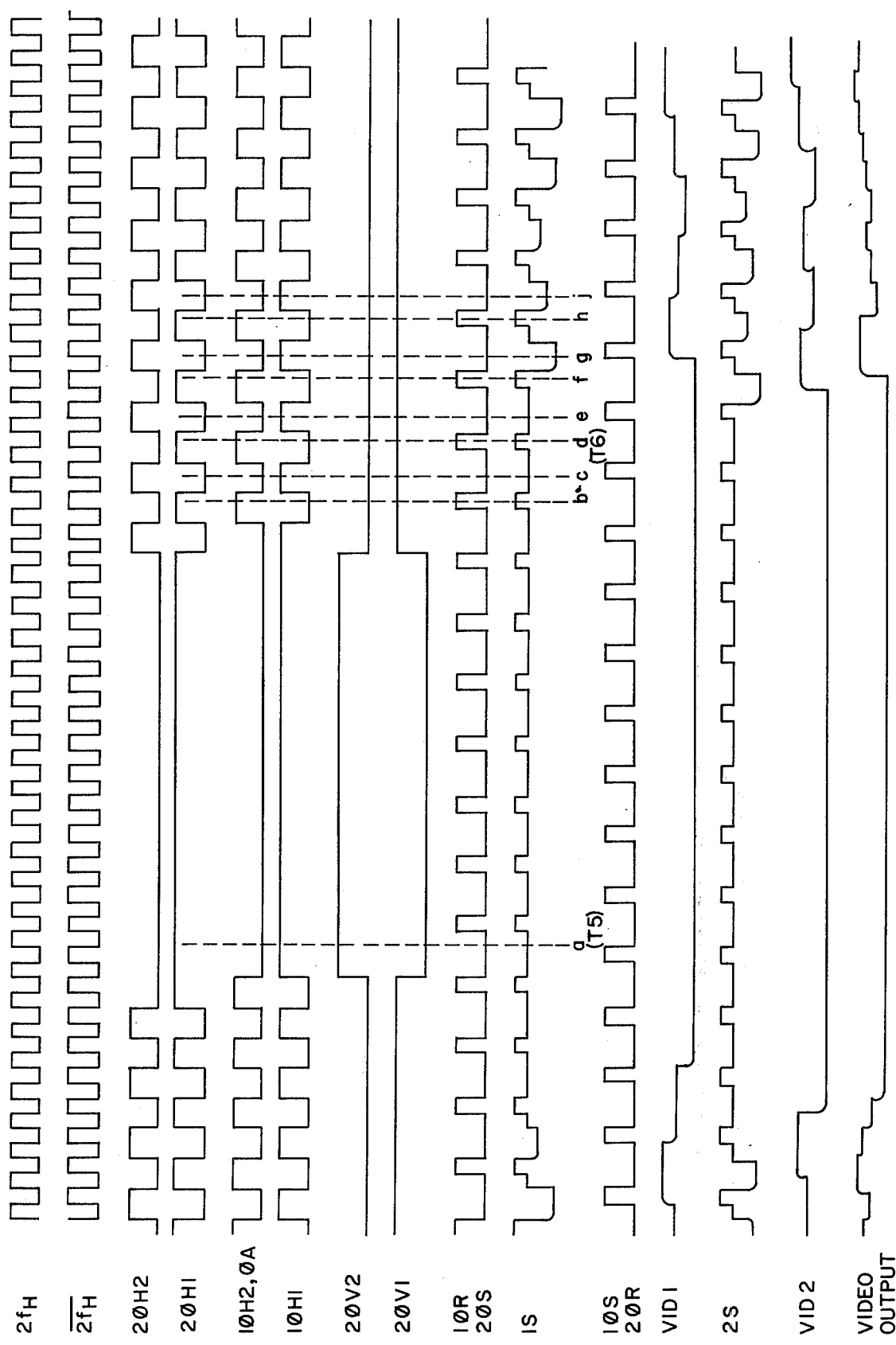
FIG. 14 is an expanded time scale reproduction of a portion of the waveforms of FIG. 13.

In FIG. 14 is shown, at an expanded scale, a portion of a number of the waveforms including the end of one horizontal line period, the horizontal retrace period (blanked), and the first part of the following horizontal line such as the portion indicated by A in FIG. 13.

In FIGS. 15, 16, 17, and 18 are shown modifications of the components of the combinational logic unit 105 which were described earlier and illustrated in FIGS. 6, 8, 9, and 10, respectively.

Figure 15:
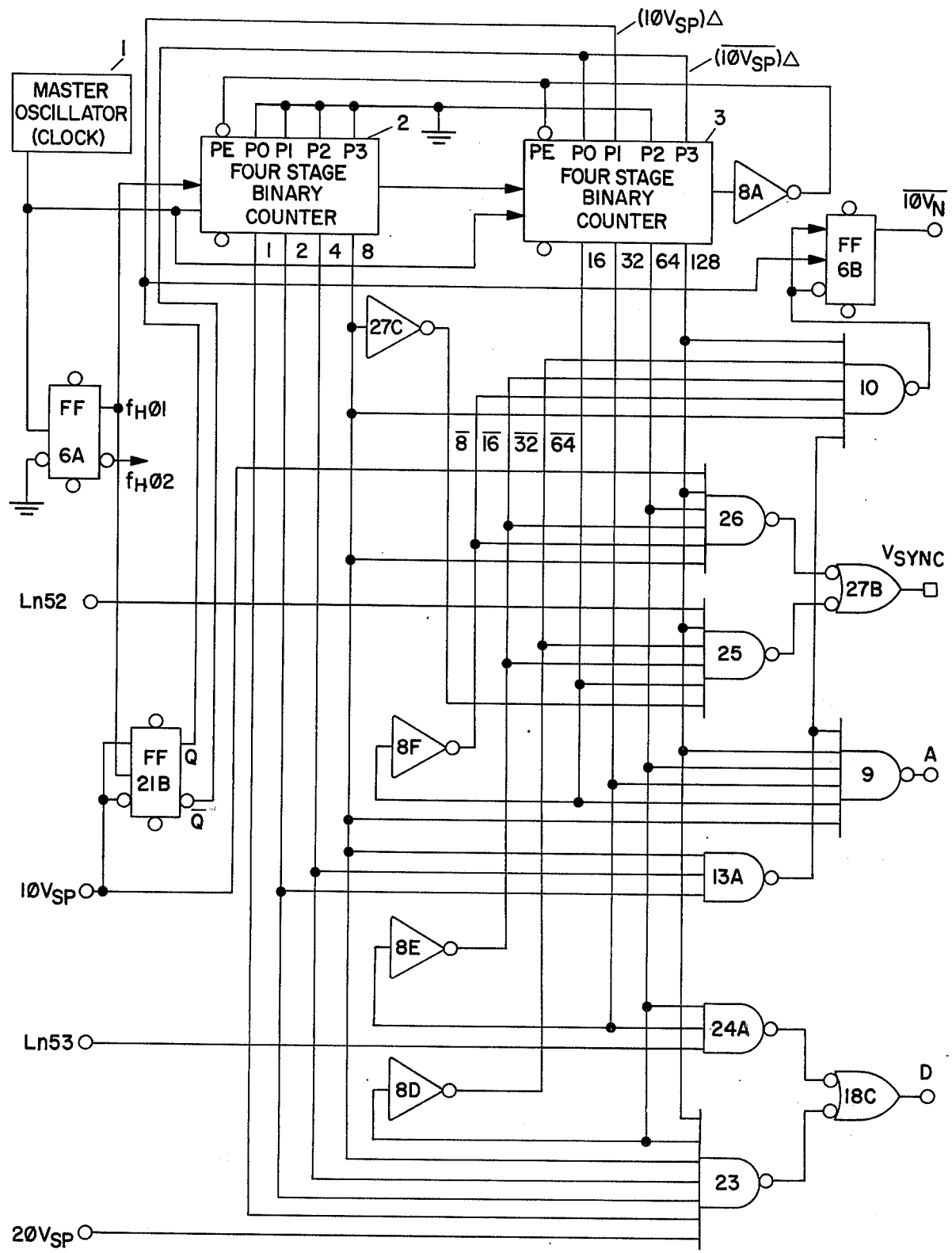
FIG. 15 is a schematic diagram of an element counter and decoder unit constituting one component of the combinational logic unit of FIG. 1 as configured to provide an alternate mode of operation.

Referring to FIG. 15, the element counter and decoder component illustrated in FIG. 6 is modified to adapt its operation to the alternate form of the invention. Specifically, the Q output of flip-flop 21B is applied to the $P_1$ terminal of counter 3 and the $\overline{Q}$ output of flip-flop 21B is applied to the $P_0$ and $P_3$ terminals of counter 3. This change has the effect of causing the element counter to divide by 112 at all times except during interval 1 when it divides by 224.

Figure 16:
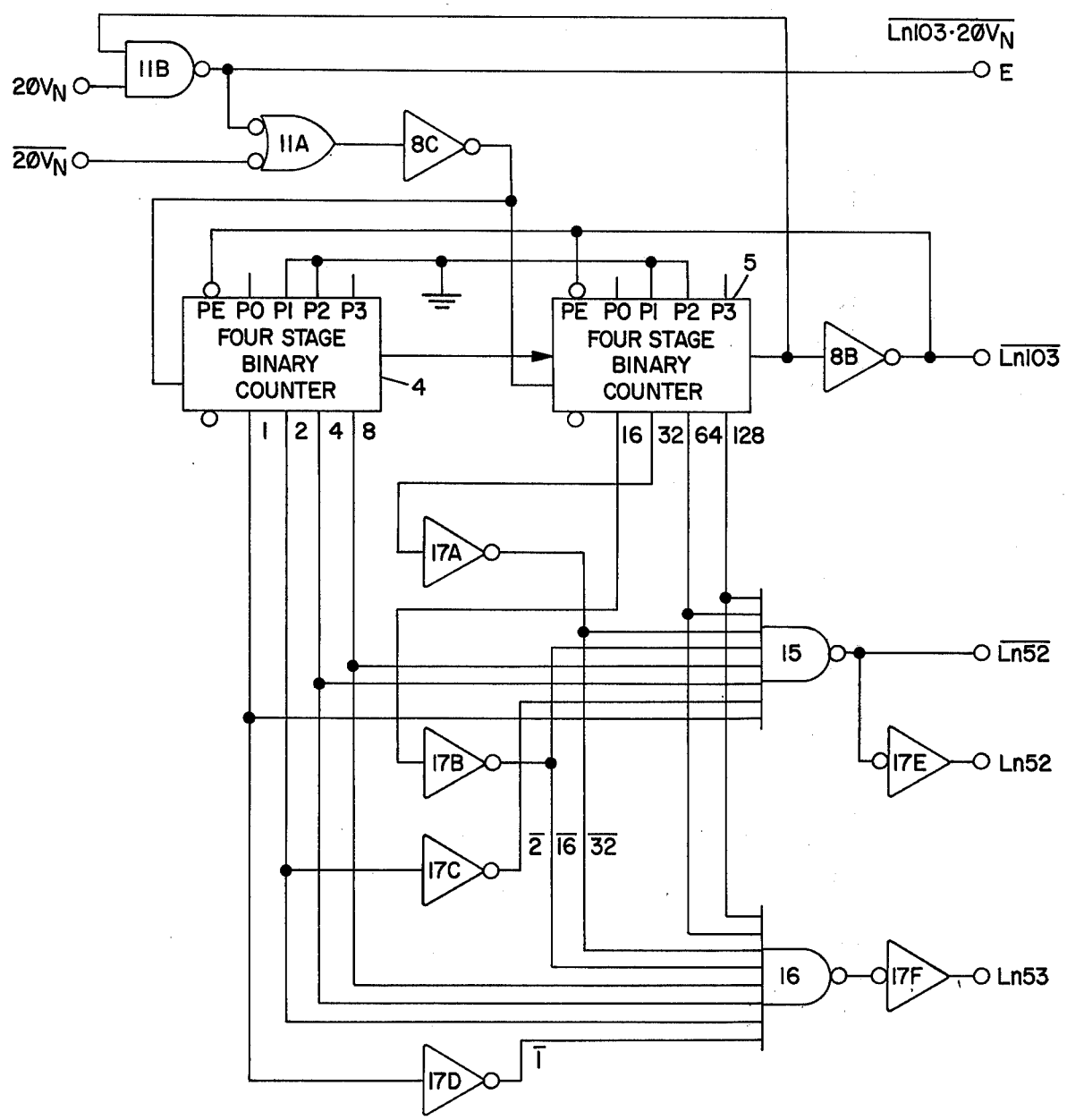

Referring to FIG. 16, the line counter and decoder component illustrated in FIG. 8 is modified by substituting the signal $2\phi V_N$ in place of the signal $1\phi V_N$ as one of the inputs to gate 11B. This produces the signal $\overline{Ln103 \cdot 2\phi V_N}$ as the output at E.

Figure 17:
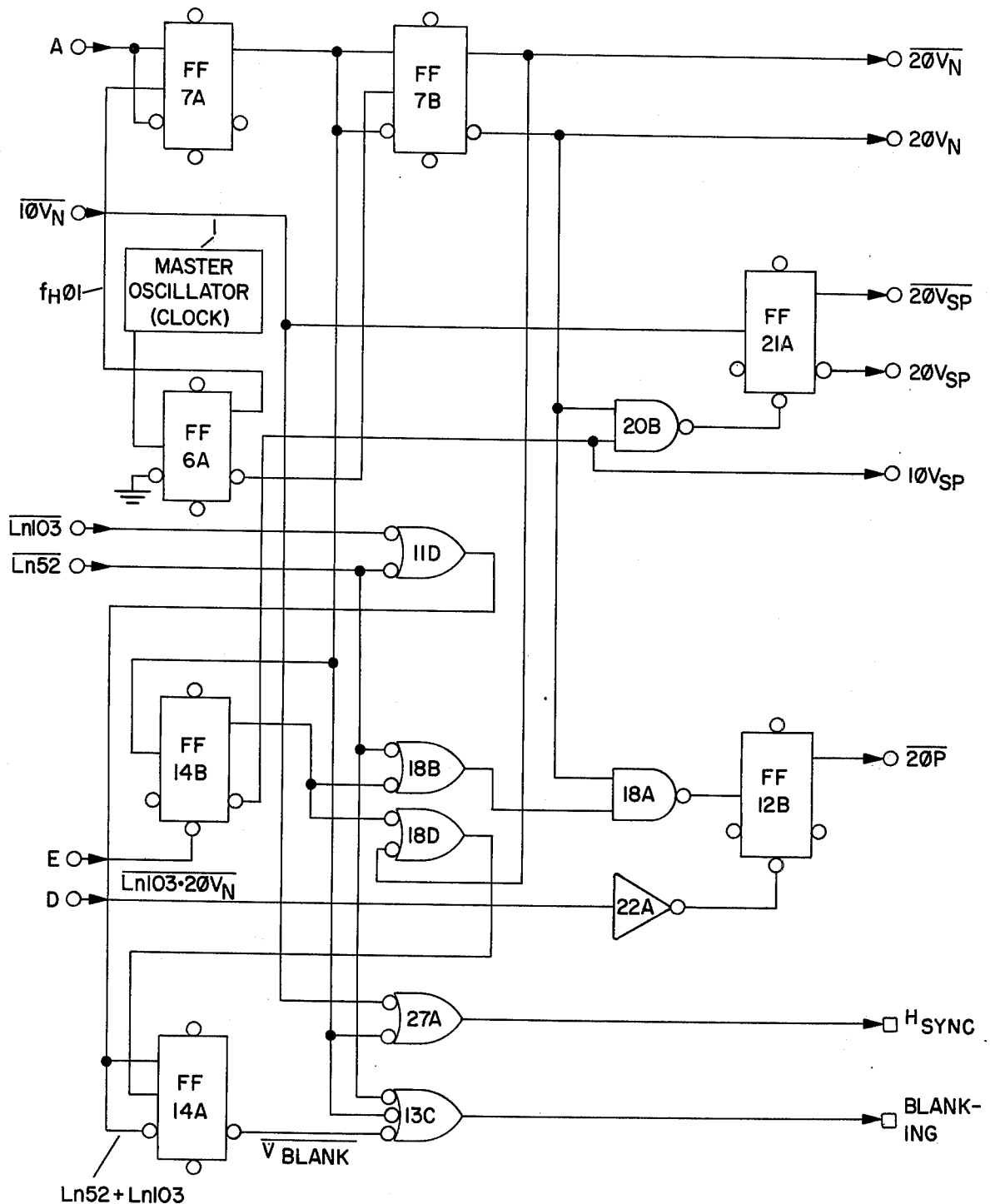
FIGS. 17 and 18 are schematic diagrams of additional components of the combinational logic unit of FIG. 1 as configured to provide an alternate mode of operation.

Referring to FIG. 17, the component illustrated in FIG. 9 is modified to produce blanking signals appropriate to the revised operation. Specifically, signal $\overline{2\phi V_N}$ is substituted in place of $\overline{1\phi V_N}$ as one of the inputs to gate 18D and signal $\overline{Ln52}$ is substituted in place of $\overline{1\phi V_N}$ as one of the inputs to gate 13C. This component is also modified to produce vertical clock signals for the devices that are appropriate to the revised operation. Specifically, the signal $\overline{1\phi V_N}$ is substituted in place of the signal derived from gate 20A as the clock input to flip-flop 21A.

Figure 18:
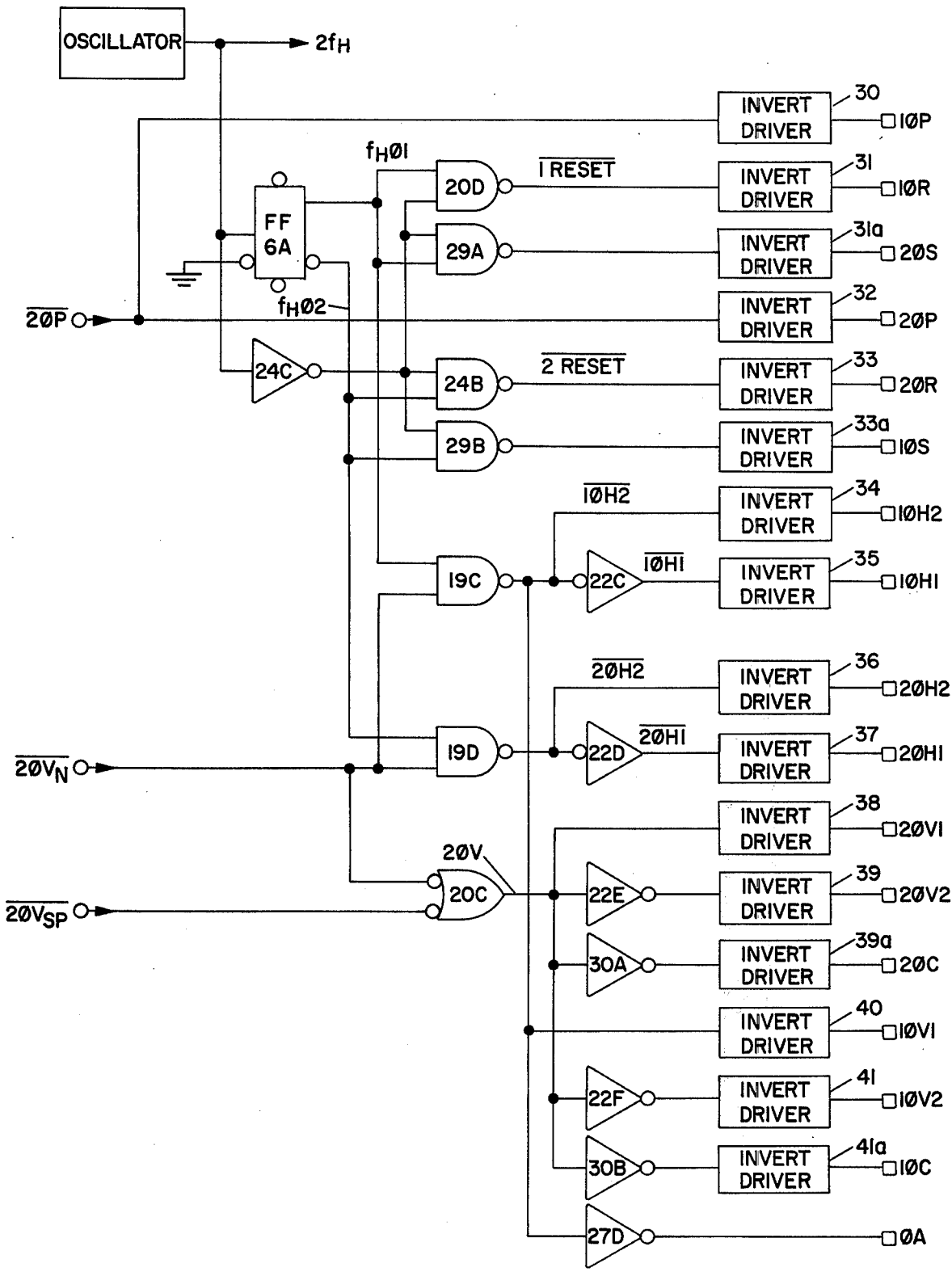

Referring to FIG. 18, the component illustrated in FIG. 10 is modified to produce identical vertical clock signals for CCAIDs 100 and 101 that are appropriate to the revised operation. Specifically, the signal $2\phi V$ resulting as the output of gate 20C is substituted in place of the signal $1\phi V$ as the input to the gates 22F and 30B and to the driver 40. This component is also modified to produce horizontal clock signals for CCAID 100 that occur during the same horizontal line period as those for CCAID 101, as is appropriate for the revised operation. Specifically, the signal $\overline{2\phi V_N}$ is substituted in place of the output signal from inverter 22B as one of the inputs to gate 19C. The component is also modified to produce phototransfer pulses for the two CCAIDs that occur at the same instants as is appropriate for the revised operation. Specifically, the signal $\overline{2\phi P}$ is substituted in place of the signal $\overline{1\phi P}$ as the input to the driver 30.

Several of the devices are not needed for this mode of operation and therefore do not appear in FIGS. 15, 16, 17, and 18. These include gate 13B and outputs C and $1\phi V_N$ of the modified component of FIG. 6 illustrated in FIG. 15; output Ln53 of the modified component of FIG. 8 illustrated in FIG. 16; inputs C and $1\phi V_N$, gates 20A and 11C, flip-flop 12A, and outputs $\overline{1\phi P}$ and $1\phi V$ of the modified component of FIG. 9 illustrated in FIG. 17; and inputs $\overline{1\phi P}$, $2\phi V_N$, $1\phi V_{sp}$, $\overline{1\phi V_N}$ and $1\phi V$, inverter 22B, and gates 19A and 19B of the modified component of FIG. 10 illustrated in FIG. 18.

The specific implementation of the mode of operation described about doubles the number of displayed picture elements for each of the scanning lines comprising a complete TV frame. Thus, this operating mode is particularly suited for applications requiring maximum resolution in the horizontal direction. In addition, aliasing, that is, spurious or false image signal generation which occurs with single-area image arrays having nonphotosensitive patterned regions within the image format region, is minimized.

While there have been described what are, at present, considered to be the preferred embodiments of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. A video-signal-generating system comprising:
   a plurality of similar area-image-sensing devices, each comprising a two-dimensional array of photosensor sites arranged in rows and columns, each site being effective to produce a charge packet in response to illumination incident thereon, a charge-detection output circuit capable of producing an output signal varying with the magnitudes of successive charge packets in sequence, and means for effecting the orderly transfer of charge-packet-signal information from the photosensor sites in sequence to said charge-detection circuit;
   an optical system for simultaneously imaging a scene to be reproduced on each of said area-image-sensing devices but with the photosensor sites of at least one device offset within the image plane from corresponding photosensor sites of the others of said devices to such an extent and in such a direction that the photosensor sites of said one device sense or provide access to image point information which cannot be sensed or accessed by the others of said devices during the same field readout interval;
   control circuitry for periodically and sequentially causing the transfer of the charge-packet-signal information developed at each of the photosensor sites to the charge-detection output circuit of its respective device;
   and means for combining the output signals of said output circuits to provide a video signal for reproduction.

2. A video-signal-generating system in accordance with claim 1 in which each of said area-image-sensing devices is of the charge-coupled type and in which the means for effecting the orderly transfer of charge-packet-signal information comprises a plurality of charge-storing sites located intermediate said photosensor sites and said charge-detection circuit.

3. A video-signal-generating system in accordance with claim 1 in which the offset within the image plane of the photosensor sites of said one device from corresponding photosensor sites of the others of said devices is such that the photosensor sites of said device sense or provide access to image point information which cannot be sensed or accessed by the others of said devices.

4. A video-signal-generating system in accordance with claim 1 in which the offset within the image plane of the photosensor sites of said one device from corresponding photosensor sites of the others of said devices is a distance not greater than the spacing of such photosensor sites in the direction of offset.

5. A video-signal-generating system in accordance with claim 1 which comprises two area-image-sensing devices which are relatively offset by one row spacing of photosensor sites in one direction and by one-half column spacing of photosensor sites in the other direction.

6. A video-signal-generating system in accordance with claim 5 in which the scanning of the rows of photosensor sites of the two area-image-sensing devices is interleaved on a time basis.

7. A video-signal-generating system in accordance with claim 5 in which the scanning of photosensor sites along corresponding rows of the two area-image-sensing devices is interleaved on a time basis.

8. A video-signal-generating system in accordance with claim 1 which comprises two area-imaging-sensing devices and in which the relative offset of the two devices is selected to position the photosensor sites of one device at locations which cannot be read out during readout of the corresponding photosensor sites of the other device except during alternate field periods.

9. A video-signal-generating system in accordance with claim 6 in which the signal outputs from the two devices are combined to increase the total number of image-information samples accessed during a row-readout interval.

10. A video-signal-generating system in accordance with claim 1 which comprises two area-image-sensing devices and in which the signal outputs of said devices are combined to increase the total number of image-information samples accessed during a field-readout interval.

* * * * *